(12) United States Patent
Hung

(10) Patent No.: US 11,393,910 B2
(45) Date of Patent: Jul. 19, 2022

(54) SEMICONDUCTOR DEVICE AND FORMATION METHOD THEREOF

(71) Applicant: TAIWAN SEMICONDUCTOR MANUFACTURING CO., LTD., Hsinchu (TW)

(72) Inventor: Wei-Chiang Hung, Changhua (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 69 days.

(21) Appl. No.: 16/884,908

(22) Filed: May 27, 2020

(65) Prior Publication Data

US 2021/0226021 A1 Jul. 22, 2021

Related U.S. Application Data

(60) Provisional application No. 62/963,733, filed on Jan. 21, 2020.

(51) Int. Cl.

| | |
|---|---|
| *H01L 29/417* | (2006.01) |
| *H01L 29/78* | (2006.01) |
| *H01L 29/08* | (2006.01) |
| *H01L 29/45* | (2006.01) |
| *H01L 29/66* | (2006.01) |
| *H01L 21/285* | (2006.01) |
| *H01L 21/768* | (2006.01) |
| *H01L 23/535* | (2006.01) |

(52) U.S. Cl.
CPC .. *H01L 29/41791* (2013.01); *H01L 21/28518* (2013.01); *H01L 21/76805* (2013.01); *H01L 21/76862* (2013.01); *H01L 21/76877* (2013.01); *H01L 21/76895* (2013.01); *H01L 23/535* (2013.01); *H01L 29/0847* (2013.01); *H01L 29/45* (2013.01); *H01L 29/66795* (2013.01); *H01L 29/7851* (2013.01)

(58) Field of Classification Search
CPC .............. H01L 21/76877; H01L 21/76895
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |

(Continued)

*Primary Examiner* — Farun Lu
(74) *Attorney, Agent, or Firm* — Birch, Stewart, Kolasch & Birch, LLP

(57) ABSTRACT

A semiconductor device includes a fin structure, a source/drain region, a first inter-layer dielectric (ILD) layer, a first contact plug, and a second contact plug. The fin structure extends above a substrate. The source/drain region is in the fin structure. The first ILD layer is over the source/drain region. The first contact plug extends through the first ILD layer to a silicide region of the source/drain region. The second contact plug is over the first contact plug. The first contact plug has a protruding portion extending above the first ILD layer and laterally surrounding a lower part of the second contact plug.

20 Claims, 23 Drawing Sheets

(56) References Cited

U.S. PATENT DOCUMENTS

| | | |
|---|---|---|
| 9,859,386 B2 | 1/2018 | Ho et al. |
| 10,083,863 B1 * | 9/2018 | Hsieh .................... H01L 29/785 |
| 2017/0162784 A1 * | 6/2017 | Banno .................... H01L 45/08 |

* cited by examiner

SEMICONDUCTOR DEVICE AND FORMATION METHOD THEREOF

CROSS-REFERENCE TO RELATED APPLICATION

This application claims priority to U.S. Provisional Application Ser. No. 62/963,733, filed Jan. 21, 2020, which is herein incorporated by reference in its entirety.

BACKGROUND

With the sizes of an integrated circuits becoming increasing smaller, the respective formation processes also become increasingly more difficult, and problems may occur where conventionally no problems have occurred. For example, in the formation of Fin Field-Effect Transistors (FinFETs), the sizes of the source/drain contact plugs become smaller, making contact resistance increasingly higher.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
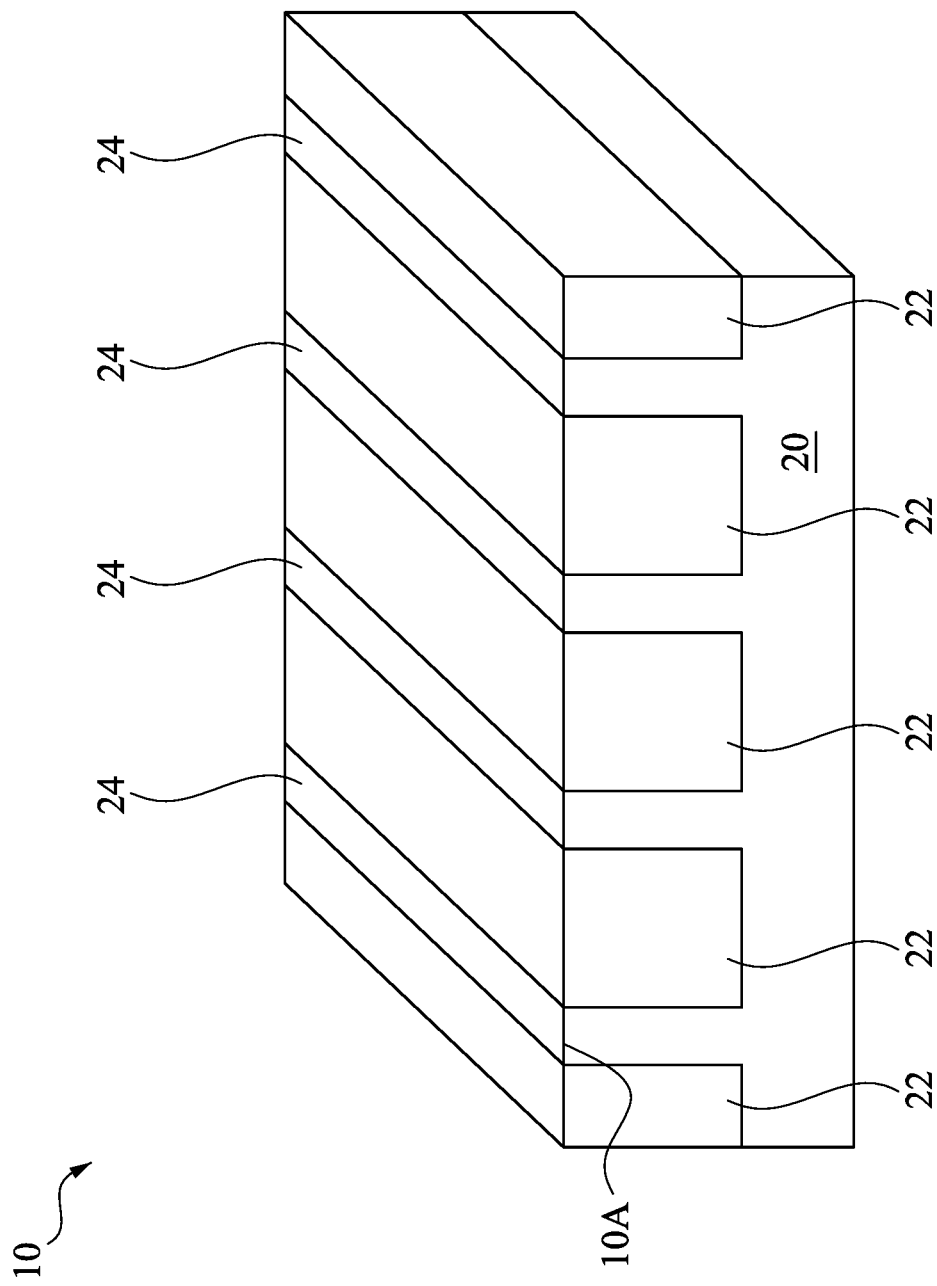
FIGS. 1 through 5 and FIG. 6A are perspective views of the intermediate stages in the formation of a transistor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concepts of the present disclosure. Planar transistors may also adopt the concept of the present disclosure.

FIGS. 1 through 16 illustrate the cross-sectional views and perspective views of intermediate stages in the formation of FinFETs in accordance with some embodiments of the present disclosure.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates a perspective view of an initial structure. The initial structure includes a wafer 10, which further includes a substrate 20. The substrate 20 may be a semiconductor substrate, which may be a silicon substrate, a silicon germanium substrate, or a substrate formed of other semiconductor materials. The substrate 20 may be doped with a p-type or an n-type impurity. Shallow Trench Isolation (STI) regions 22 may be formed to extend from a top surface of the substrate 20 into the substrate 20, wherein the top surface of substrate 20 is a major surface 10A of the wafer 10. The portions of the substrate 20 between neighboring STI regions 22 are referred to as semiconductor strips 24. The top surfaces of the semiconductor strips 24 and the top surfaces of STI regions 22 may be substantially level with each other in accordance with some exemplary embodiments.

The STI regions 22 may include a liner oxide (not shown), which may be a thermal oxide formed through a thermal oxidation of a surface layer of the substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The STI regions 22 may also include a dielectric material over the liner oxide, wherein the dielectric material may be formed using Flowable Chemical Vapor Deposition (FCVD), spin-on, or the like.

Figure 2:
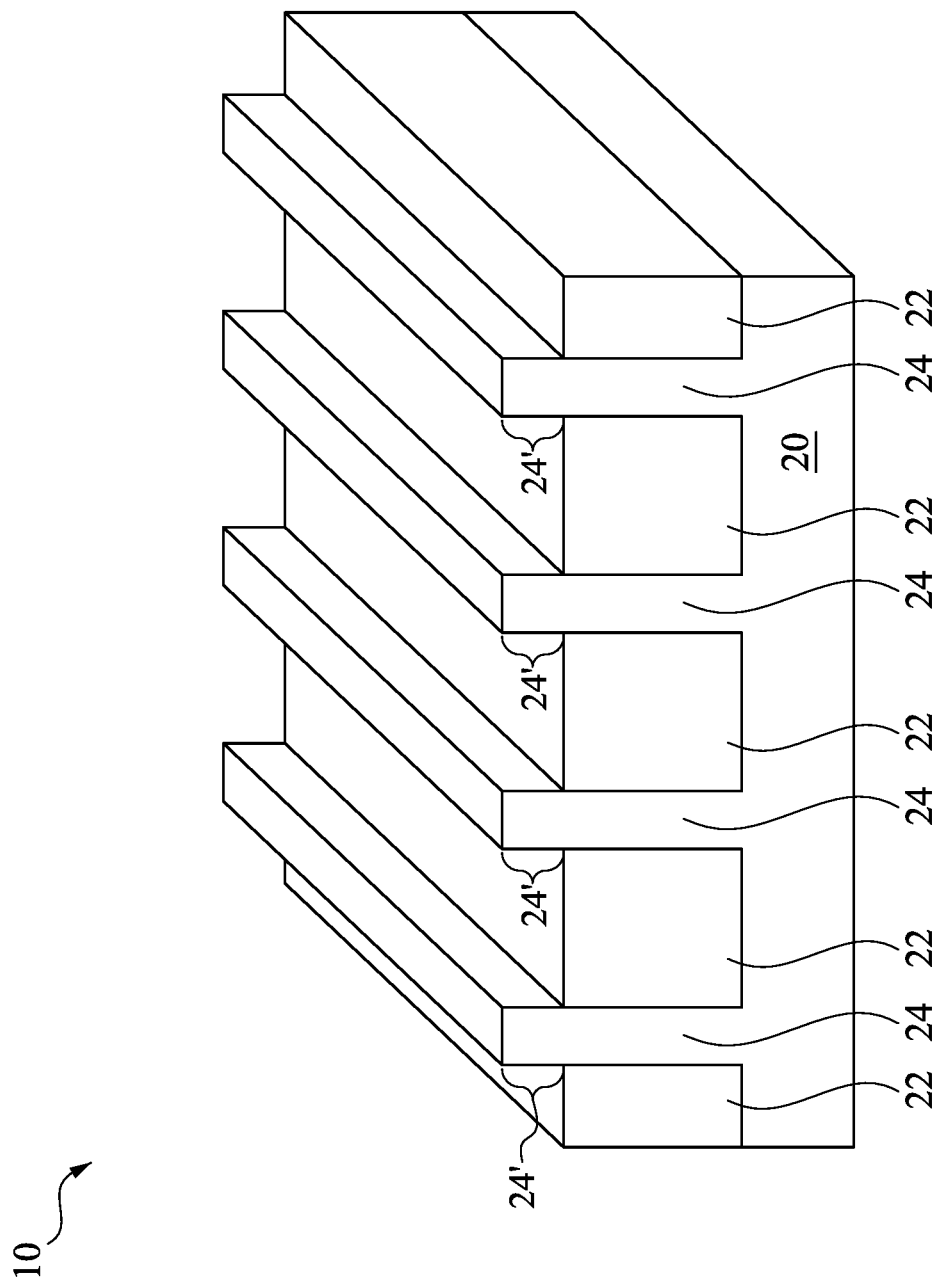

Referring to FIG. 2, STI regions 22 are recessed, so that the top portions of semiconductor strips 24 protrude higher than the top surfaces of STI regions 22 to form protruding fins 24'. The etching may be performed using a dry etching process, in which $HF_3$ and $NH_3$ are used as the etching gases. During the etching process, plasma may be generated. Argon may also be included. In accordance with alternative embodiments of the present disclosure, the recessing of the STI regions 22 is performed using a wet etch process. The etching chemical may include HF, for example.

Figure 3:
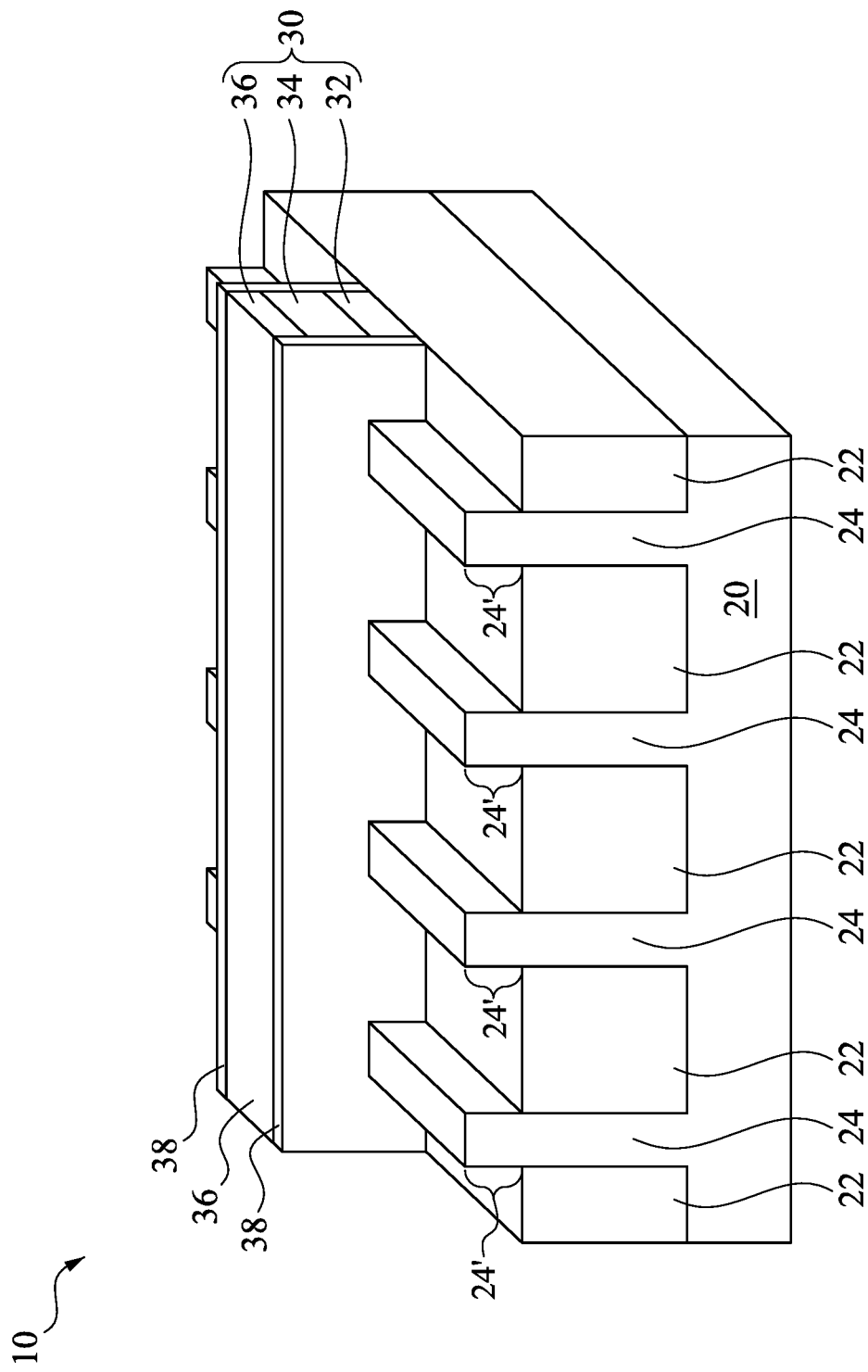

Referring to FIG. 3, a dummy gate stack 30 is formed on the top surfaces and the sidewalls of (protruding) fins 24'. It is appreciated that although one dummy gate stack 30 is illustrated for clarity, there may be a plurality of dummy gate stacks formed, which are parallel to each other, with the plurality of dummy gate stacks crossing the same protruding fin(s) 24'. The dummy gate stack 30 may include a dummy gate dielectric 32 and a dummy gate electrode 34 over the dummy gate dielectric 32. The dummy gate electrode 34 may be formed, for example, using polysilicon, and other materials may also be used. The dummy gate stack 30 may also include one (or a plurality of) hard mask layer 36 over the dummy gate electrode 34. The hard mask layer 36 may be formed of silicon nitride, silicon carbo-nitride, or the like. The dummy gate stack 30 may cross over a single one or a plurality of protruding fins 24' and/or STI regions 22. The dummy gate stack 30 also has a lengthwise direction perpendicular to the lengthwise directions of the protruding fins 24'.

Next, gate spacers 38 are formed on the sidewalls of dummy gate stack 30. In accordance with some embodiments of the present disclosure, the gate spacers 38 are formed of a dielectric material such as silicon carbon-oxyitride (SiCN), silicon nitride, or the like, and may have a single-layer structure or a multi-layer structure including a plurality of dielectric layers.

Figure 4:
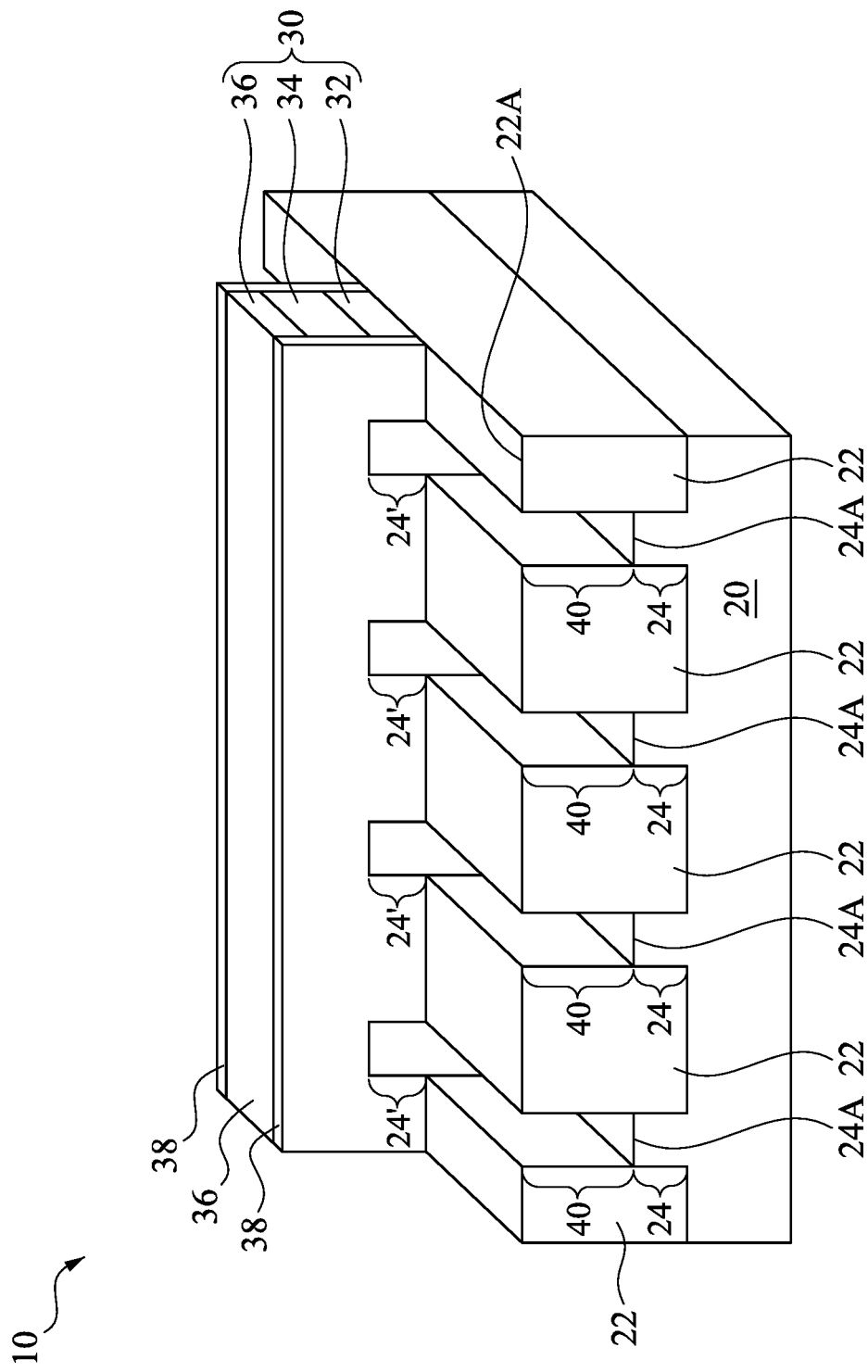

An etching step (referred to as source/drain recessing hereinafter) is then performed to etch the portions of the protruding fins 24' that are not covered by the dummy gate stack 30 and the gate spacers 38, resulting in the structure shown in FIG. 4. The recessing may be anisotropic, and hence the portions of protruding fins 24' directly underlying the dummy gate stack 30 and the gate spacers 38 are protected, and are not etched. The top surfaces 24A of the recessed semiconductor strips 24 may be lower than the top surfaces 22A of the STI regions 22 in accordance with some embodiments. Recesses 40 are accordingly formed between the STI regions 22. The recesses 40 are located on opposite sides of the dummy gate stack 30.

Figure 5:
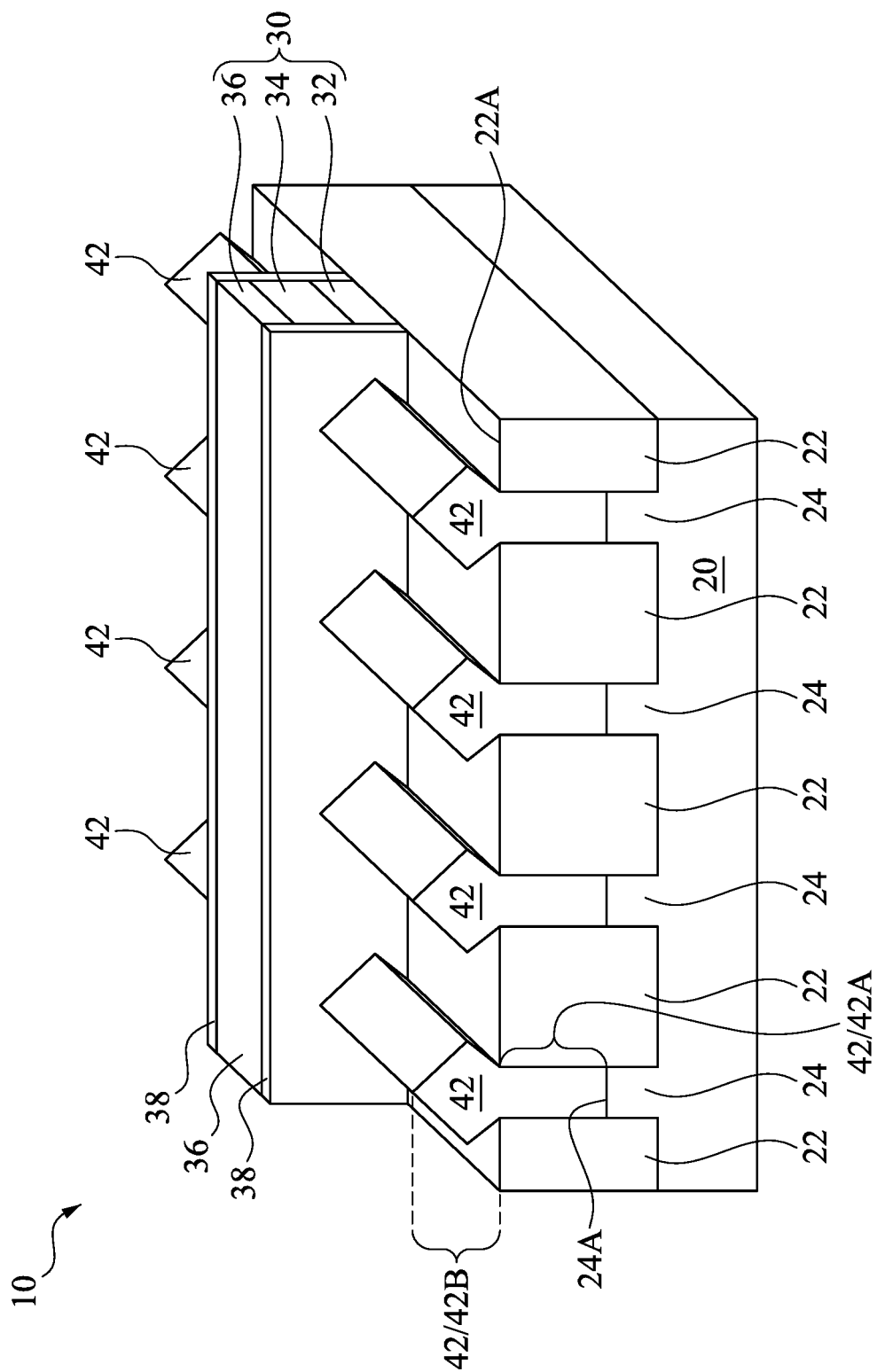

Next, epitaxy regions (source/drain regions) 42 are formed by selectively growing a semiconductor material in the recesses 40, resulting in the structure in FIG. 5. In accordance with some exemplary embodiments, the epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, the epitaxy regions 42 is formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, the epitaxy regions 42 may be further implanted with a p-type or an n-type impurity to form source and drain regions, which are also denoted using reference numeral 42. In accordance with alternative embodiments of the present disclosure, the implantation step is skipped when the epitaxy regions 42 are in-situ doped with the p-type or n-type impurity during the epitaxy. The epitaxy regions 42 include lower portions 42A that are formed in the STI regions 22, and upper portions 42B that are formed over the top surfaces 22A of the STI regions 22. The lower portions 42A, whose sidewalls are shaped by the shapes of the recesses 40 (FIG. 4), may have (substantially) straight edges, which may also be substantial vertical edges that are substantial perpendicular to the major surfaces (such as a bottom surface 20I3) of substrate 20.

Figure 6A:
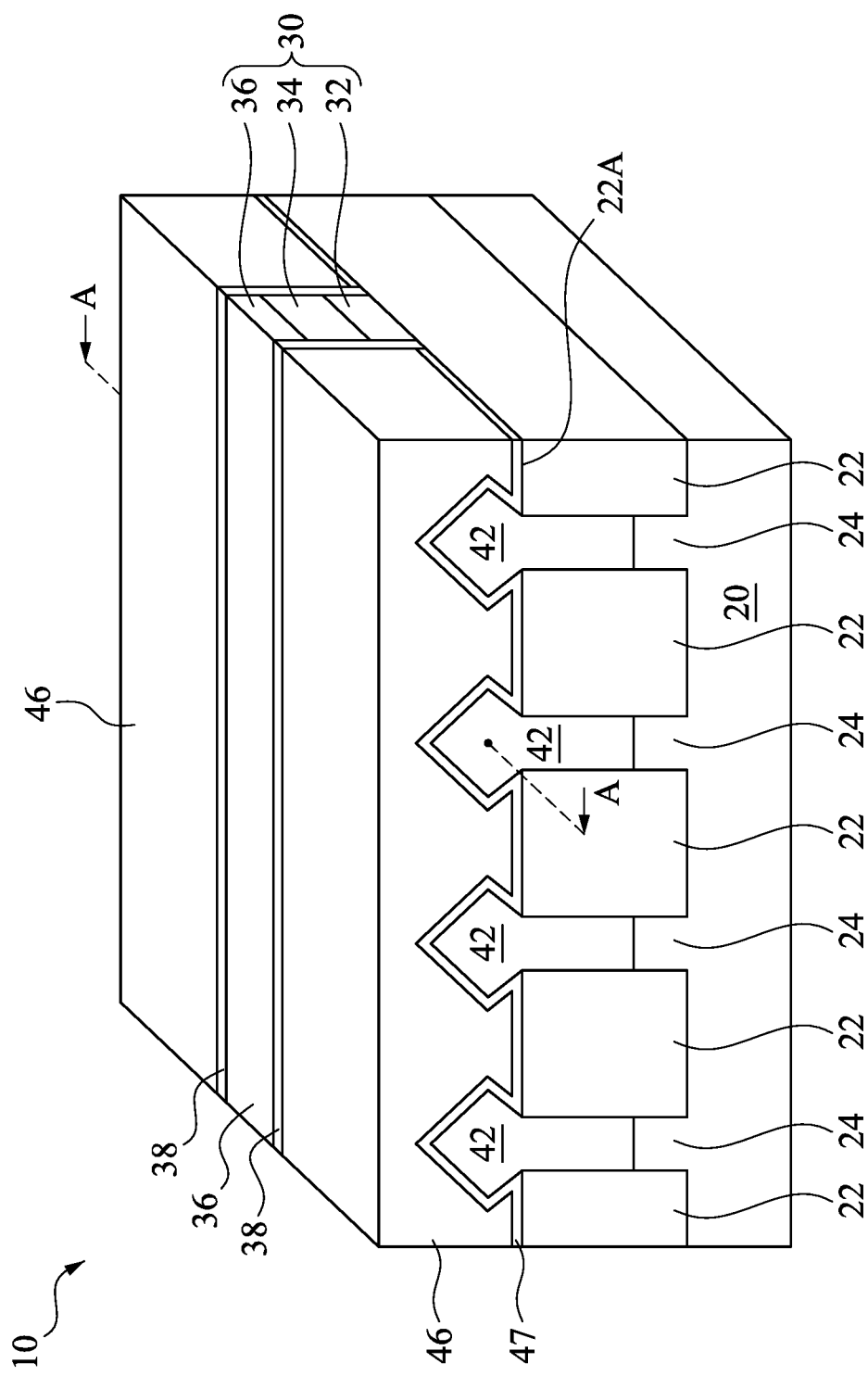

FIG. 6A illustrates a perspective view of the structure with an inter-Layer Dielectric (ILD) 46 being formed. In accordance with some embodiments of the present disclosure, a buffer oxide layer (not shown) and a Contact Etch Stop Layer (CESL) 47 are formed on the source/drain regions 42 before the formation of the ILD 46. The buffer oxide layer may be formed of silicon oxide, and the CESL 47 may be formed of silicon nitride, silicon carbo-nitride, or the like. The buffer oxide layer and the CESL 47 may be formed using a conformal deposition method such as ALD, for example. The ILD 46 may include a dielectric material formed using, for example, FCVD, spin-on coating, CVD, or other deposition methods. The ILD 46 may also be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of the ILD 46, the dummy gate stack 30, and the gate spacers 38 with each other.

Figure 6B:
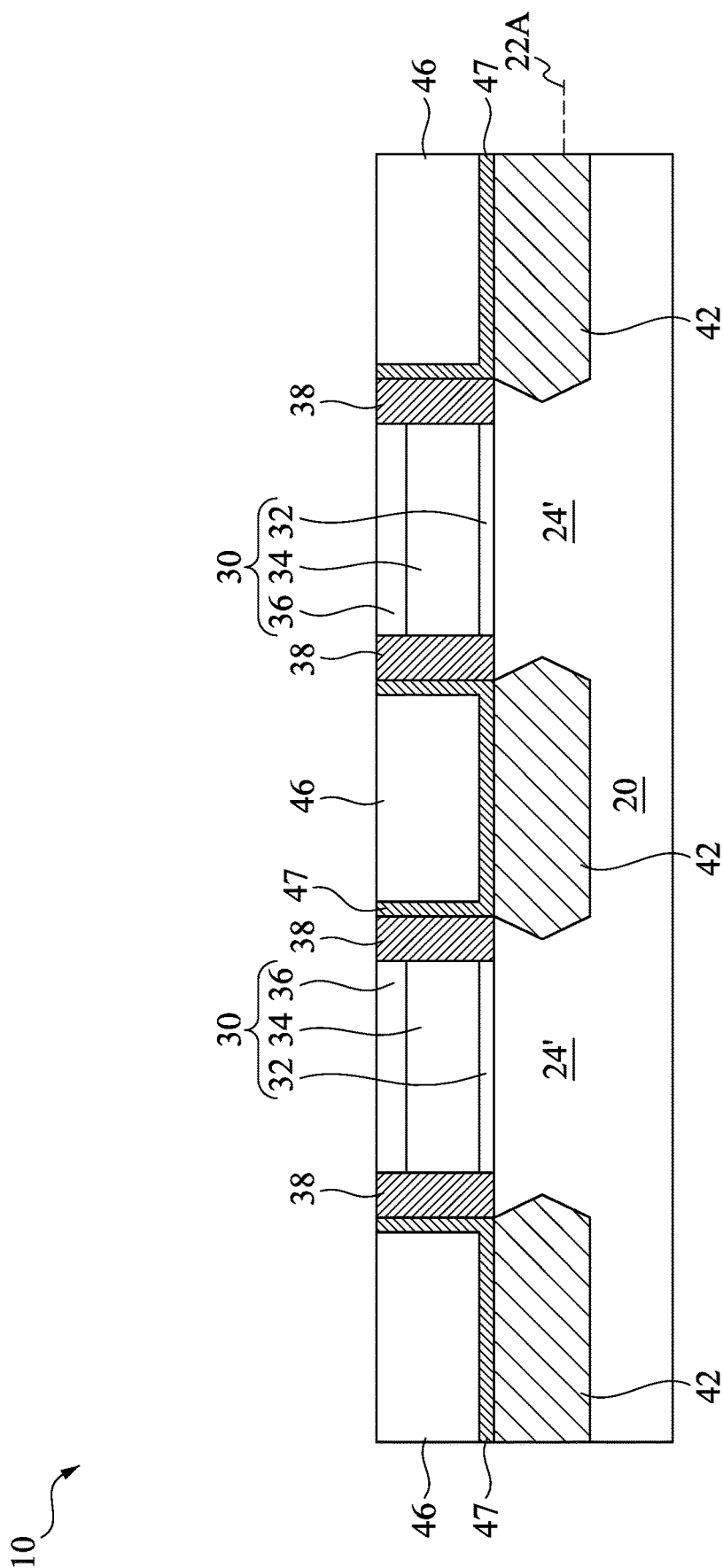
FIG. 6B and FIGS. 7 through 21 are cross-sectional views of the intermediate stages in the formation of a transistor in accordance with some embodiments.

A cross-sectional view of the structure shown in FIG. 6A is illustrated in FIG. 6B, wherein the cross-sectional view is obtained from the vertical plane containing line A-A in FIG. 6A. In the cross-sectional view, two of the plurality of dummy gate stacks 30 are illustrated, and the source/drain regions 42 formed between the neighboring dummy gate stacks 30 are illustrated. It is appreciated that more dummy gate stacks 30 and source/drain regions 42 may be formed in an alternating layout.

Figure 7:
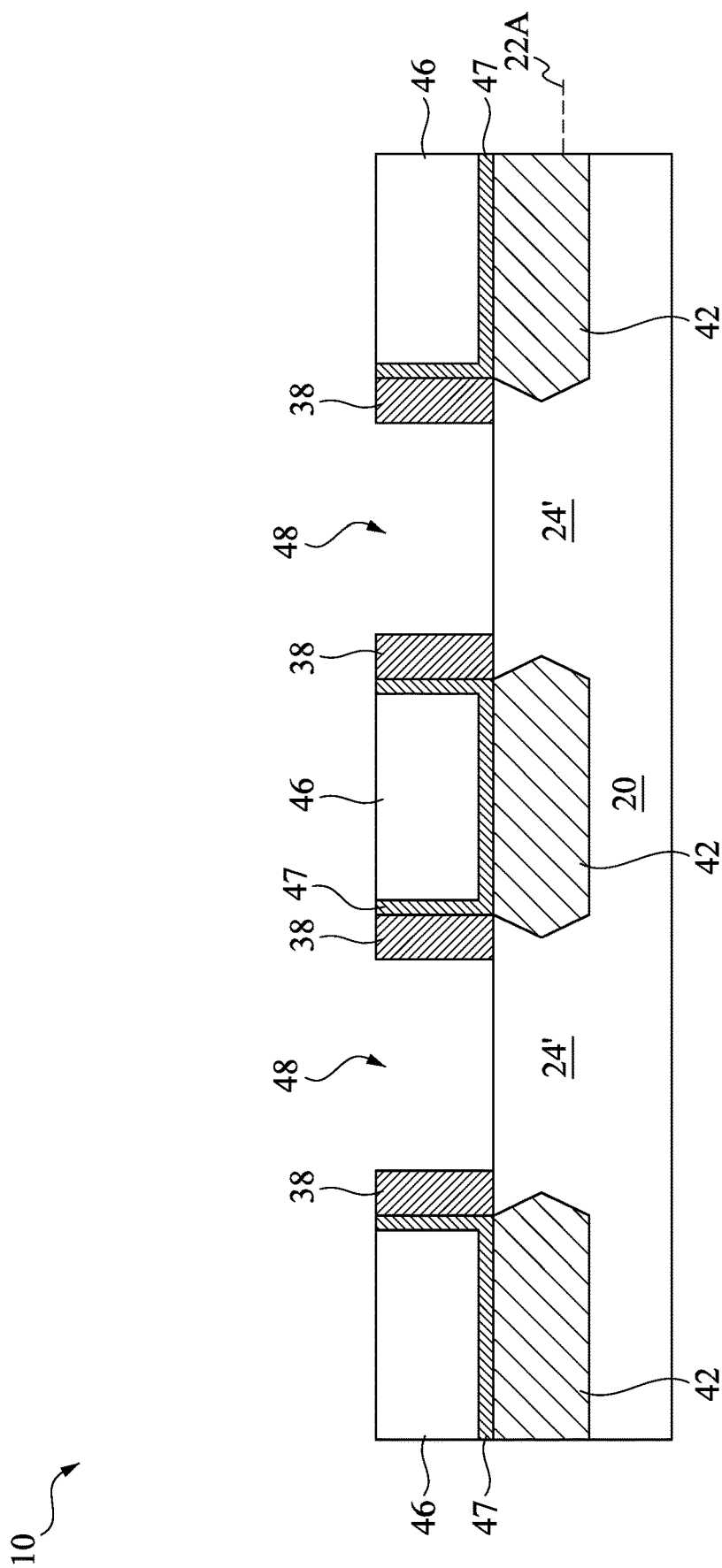
Figure 8:
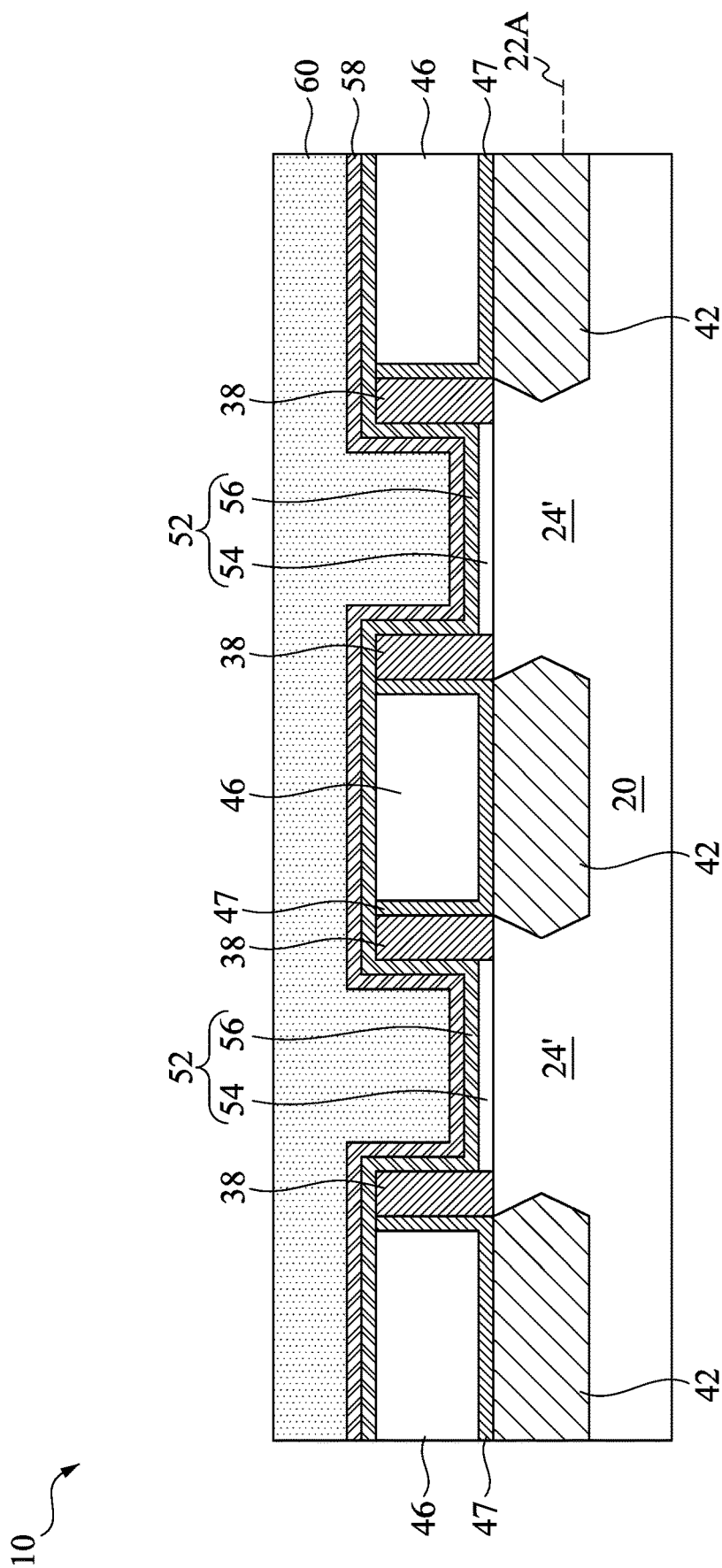

Next, the dummy gate stacks 30, which include the hard mask layers 36, the dummy gate electrodes 34 and the dummy gate dielectrics 32 are replaced with replacement gate stacks, which include metal gates and replacement gate dielectrics as shown in FIGS. 7 and 8. The cross-sectional views shown in FIGS. 7 and 8 and the subsequent FIGS. 9 through 21 are obtained from the same vertical plane containing line A-A in FIG. 6A. In FIGS. 7 through 21, the level of the top surfaces 22A of the STI regions 22 are illustrated, and the protruding fins 24' are over the level of the top surfaces 22A.

When replacing the dummy gate stacks 30, the hard mask layers 36, the dummy gate electrodes 34, and the dummy gate dielectrics 32 as shown in FIGS. 6A and 6B are first removed in one or a plurality of etching steps, resulting in trenches 48 as shown in FIG. 7. The top surfaces and the sidewalls of protruding fins 24' are exposed to trenches 48.

Next, referring to FIG. 8, a gate dielectric layer 52 is formed, which extend into the trenches 48 (FIG. 7). In accordance with some embodiments of the present disclosure, the gate dielectric layer 52 includes an Interfacial Layer (IL) 54 as its lower part. The IL 54 is formed on the exposed surfaces of protruding fins 24'. The IL 54 may include an oxide layer such as a silicon oxide layer, which is formed through the thermal oxidation of the protruding fins 24', a chemical oxidation process, or a deposition process. The gate dielectric layer 52 may also include a high-k dielectric layer 56 formed over the IL 54. The high-k dielectric layer 56 includes a high-k dielectric material such as hafnium oxide, lanthanum oxide, aluminum oxide, zirconium oxide, or the like. The dielectric constant (k-value)

of the high-k dielectric material is higher than 3.9, and may be higher than about 7.0. The high-k dielectric layer 56 is overlying, and may contact, the IL 54. The high-k dielectric layer 56 is formed as a conformal layer, and extends on the sidewalls of the protruding fins 24' and the top surface and the sidewalls of the gate spacers 38. In accordance with some embodiments of the present disclosure, the high-k dielectric layer 56 is formed using ALD or CVD.

Referring further to FIG. 8, stacked layers 58 are deposited. The sub-layers in the stacked layers 58 are not shown separately, while in reality, the sub-layers are distinguishable from each other. The deposition may be performed using a conformal deposition method such as ALD or CVD, so that thickness T1 of the vertical portions and thickness T2 of the horizontal portions of stacked layers 58 (and each of sub-layers) are substantially equal to each other. The stacked layers 58 extend into the trenches 48 (FIG. 7), and include some portions over the ILD 46.

The stacked layers 58 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The specific material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), another barrier layer, which may be another TiN layer, is formed.

Figure 9:
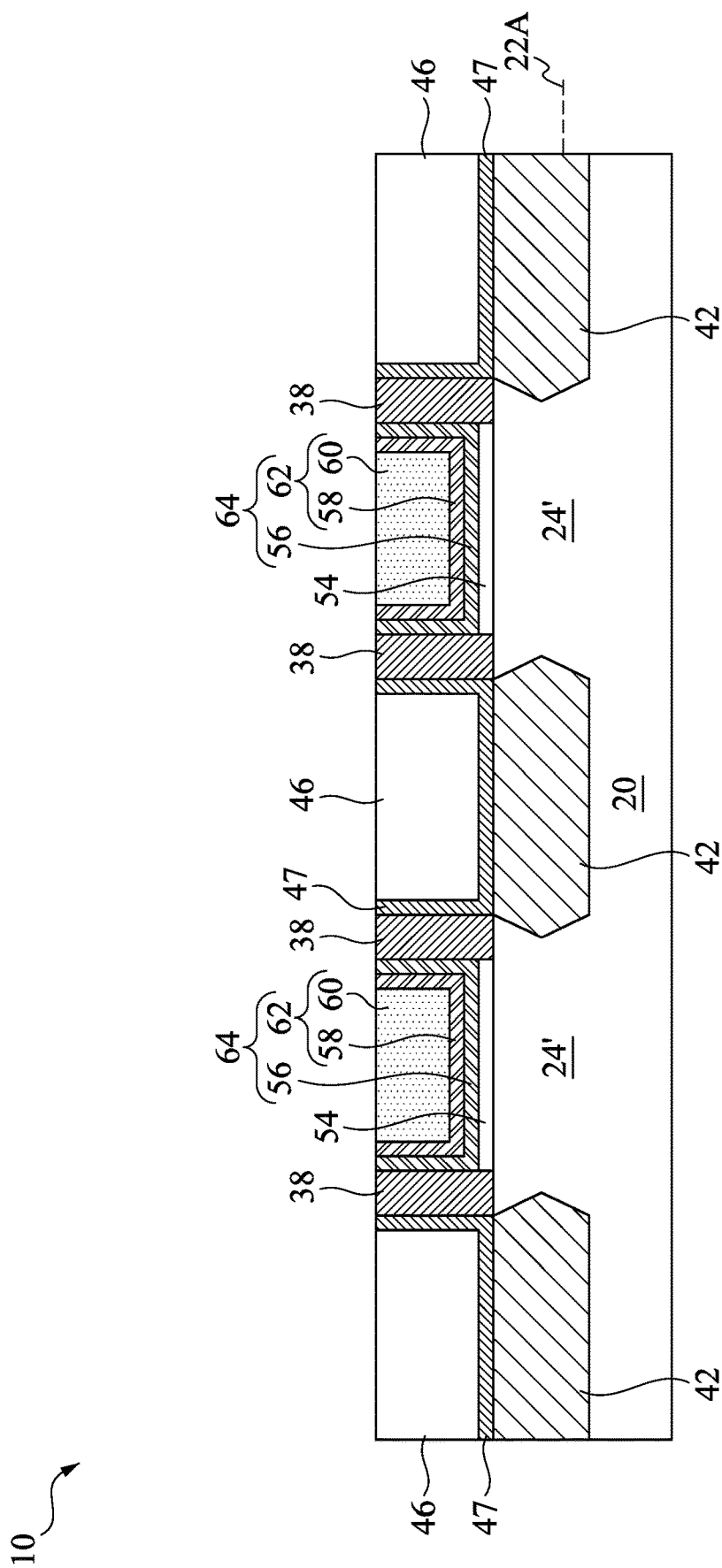

Next, a metallic material 60 is deposited, which may be formed of cobalt (Co), or tungsten (W), for example. The metallic material 60 fully fills the remaining trenches 48 (FIG. 8). In a subsequent step as shown in FIG. 9, a planarization step such as CMP or mechanical grinding is performed, so that the portions of high-k dielectric layer 56, stacked layers 58, and the metallic material 60 over the ILD 46 are removed. As a result, metal gate electrodes 62 are formed, which include the remaining portions of the stacked layers 58, and the metallic material 60. The remaining portion of the high-k dielectric layer 56, stacked layers 58, and the metallic material 60 are referred to as replacement gate stacks 64 hereinafter. As shown in FIG. 9, top surfaces of the metal gate electrodes 62, the gate spacers 38, the CESL 47, and the ILD 46 may be substantially coplanar at this time. The ILD 46 laterally surrounds the replacement gate stacks 64.

Figure 10:
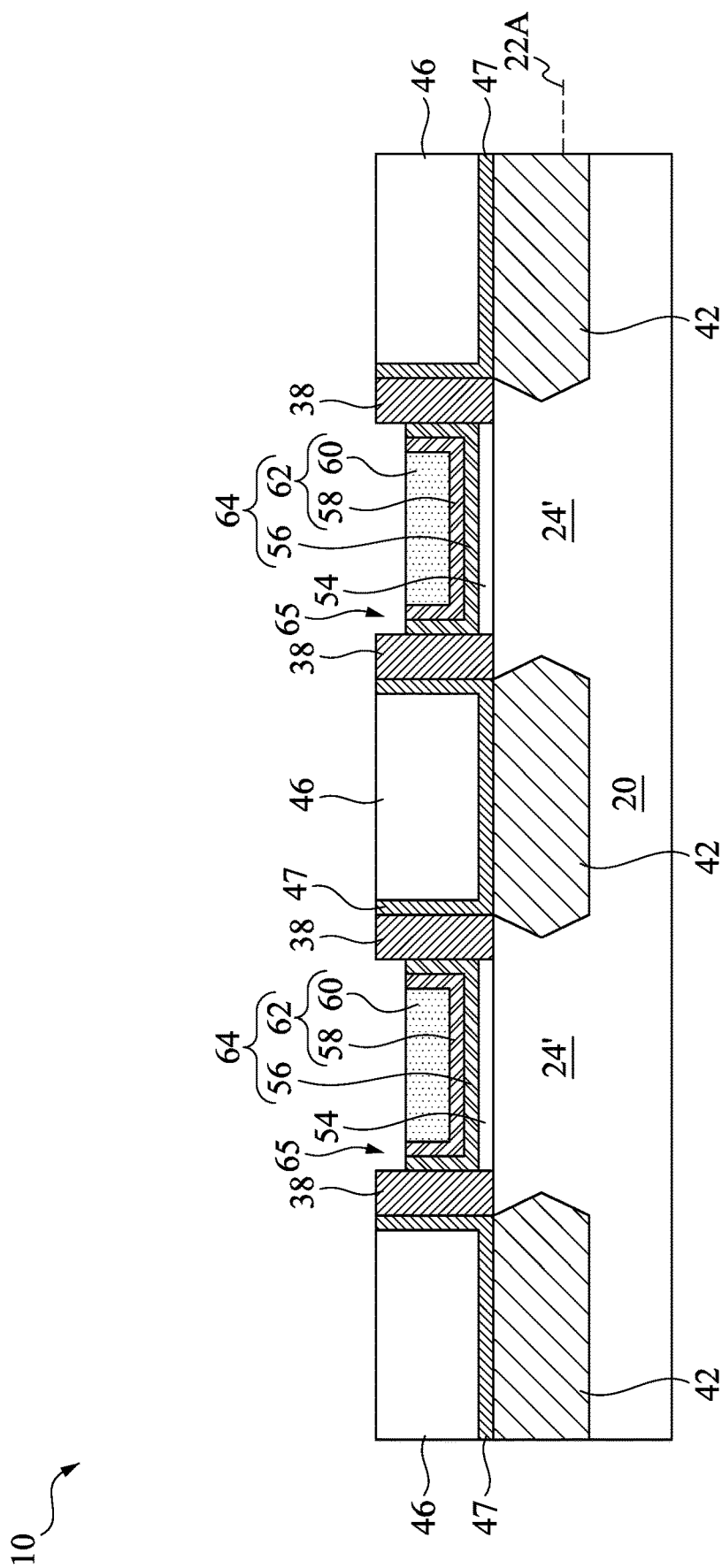

In FIG. 10, the high-k dielectric layer 56, the stacked layers 58, and the metal gate electrodes 62 are recessed in an etching step(s), so that recesses 65 are formed. The etching step(s) may include an anisotropic dry etch. For example, the etching step(s) may include a dry etch process using reaction gas(es) that selectively etch the gate dielectric layer 52, the stacked layers 58, and the metal gate electrodes 62 without etching the ILD 46 and the gate spacers 38.

Figure 11:
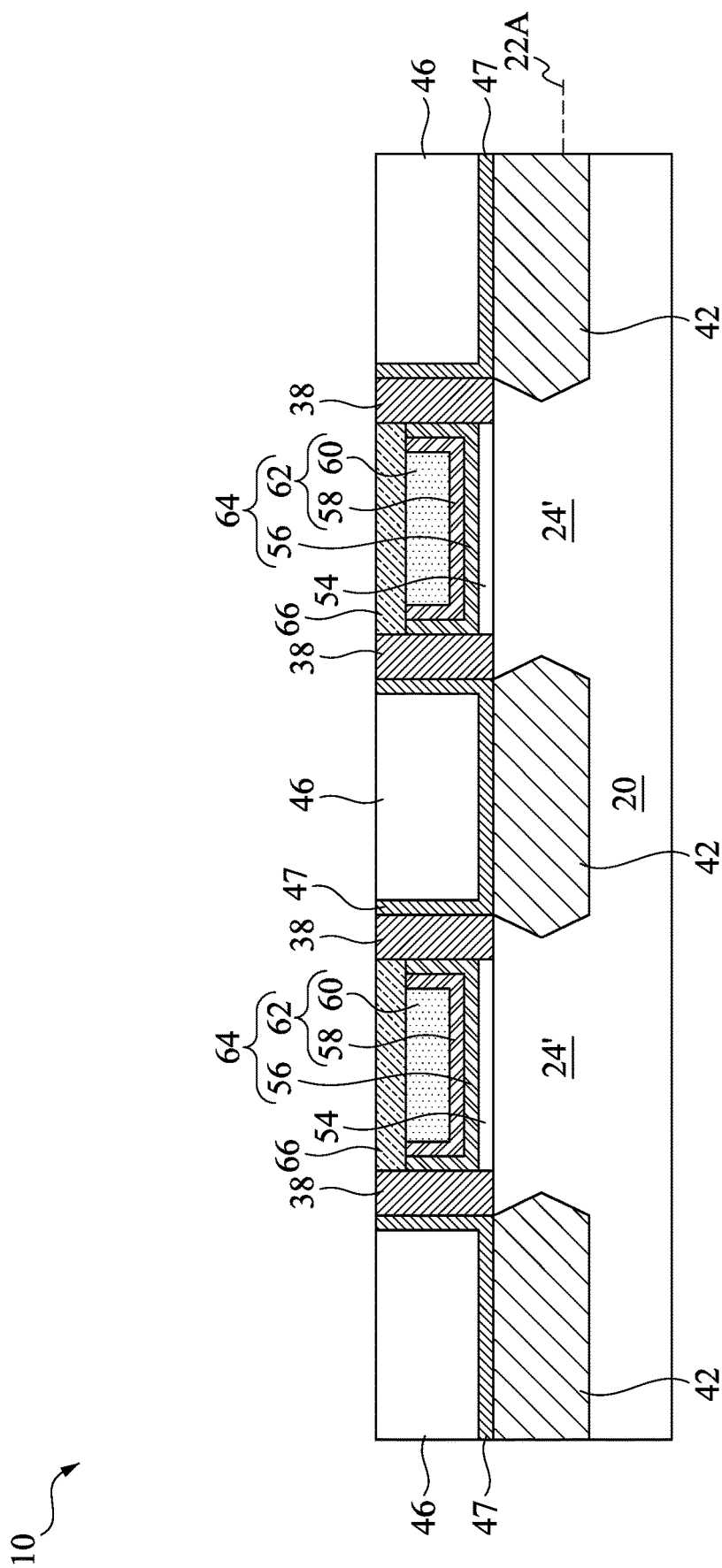

In FIG. 11, a dielectric mask layer 66 is formed in the recesses 65. The dielectric mask layer 66 extends along tops of gate dielectric layer 52, the stacked layers 58, and the metal gate electrodes 62. The dielectric mask layer 66 may be formed from SiN, SiON, SiO$_2$, the like, or a combination thereof, and may be formed by CVD, physical vapor deposition (PVD), ALD, a spin-on-dielectric process, the like, or a combination thereof. In particular, the dielectric mask layer 66 is formed such that it fills the recesses 65.

Figure 12:
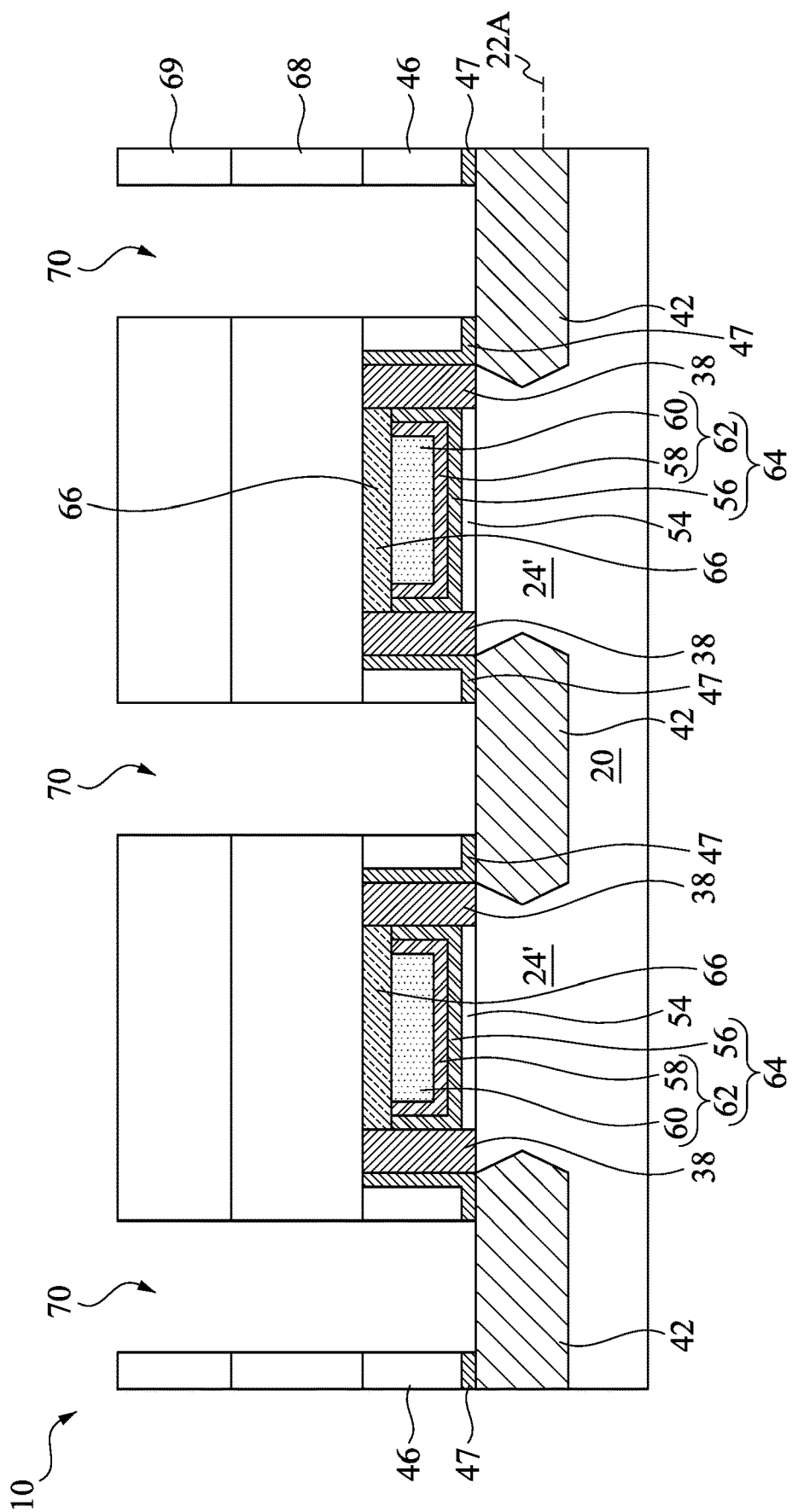

In accordance with some embodiments of the present disclosure, as shown in FIG. 12, a sacrificial dielectric layer 68 is formed, followed by the application and the patterning of a photo resist 69. In accordance with alternative embodiments of the present disclosure, the formation of the sacrificial dielectric layer 68 is skipped. The patterned photo resist 69 may be a single-layer photo resist, or may be a tri-layer including two photo resists and an inorganic layer separating the two photo resists. Next, the sacrificial dielectric layer 68, the ILD 46, and CESL 47 are etched to form source/drain contact openings 70. The patterned photo resist 69 is then removed.

Figure 13:
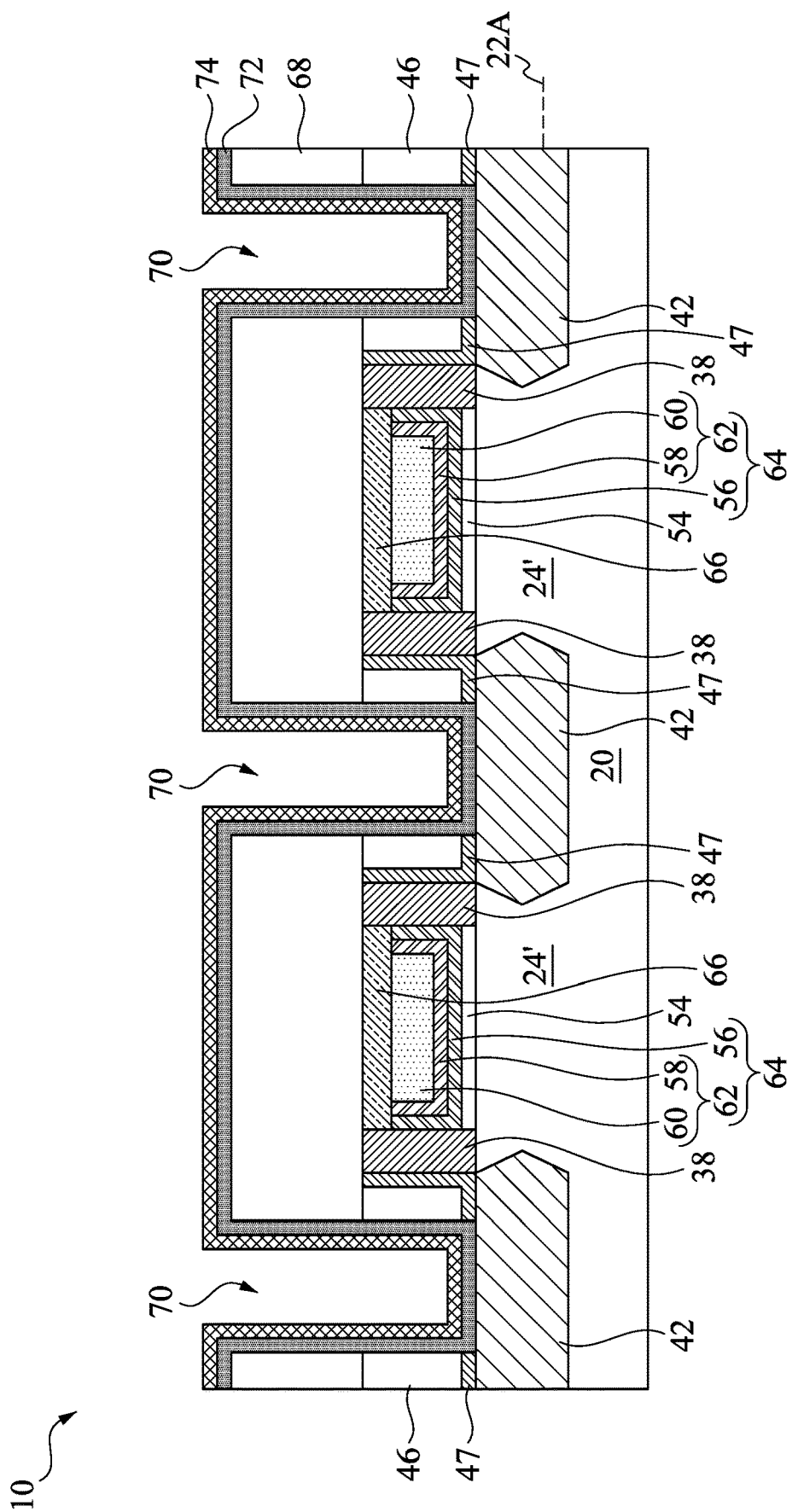

It is appreciated that source/drain contact openings 70 may be formed in a single lithography process, or may be formed in a double patterning process including two lithography processes Referring to FIG. 13, a metal layer 72 (such as a titanium layer or a cobalt layer) is deposited, for example, using PVD. A barrier layer 74, which may be a metal nitride layer such as a titanium nitride layer or a tantalum nitride layer is then formed over the metal layer 72. The barrier layer 74 may be formed using CVD. The metal layer 72 and the barrier layer are both conformal, and extend into source/drain contact openings 70.

Figure 14:
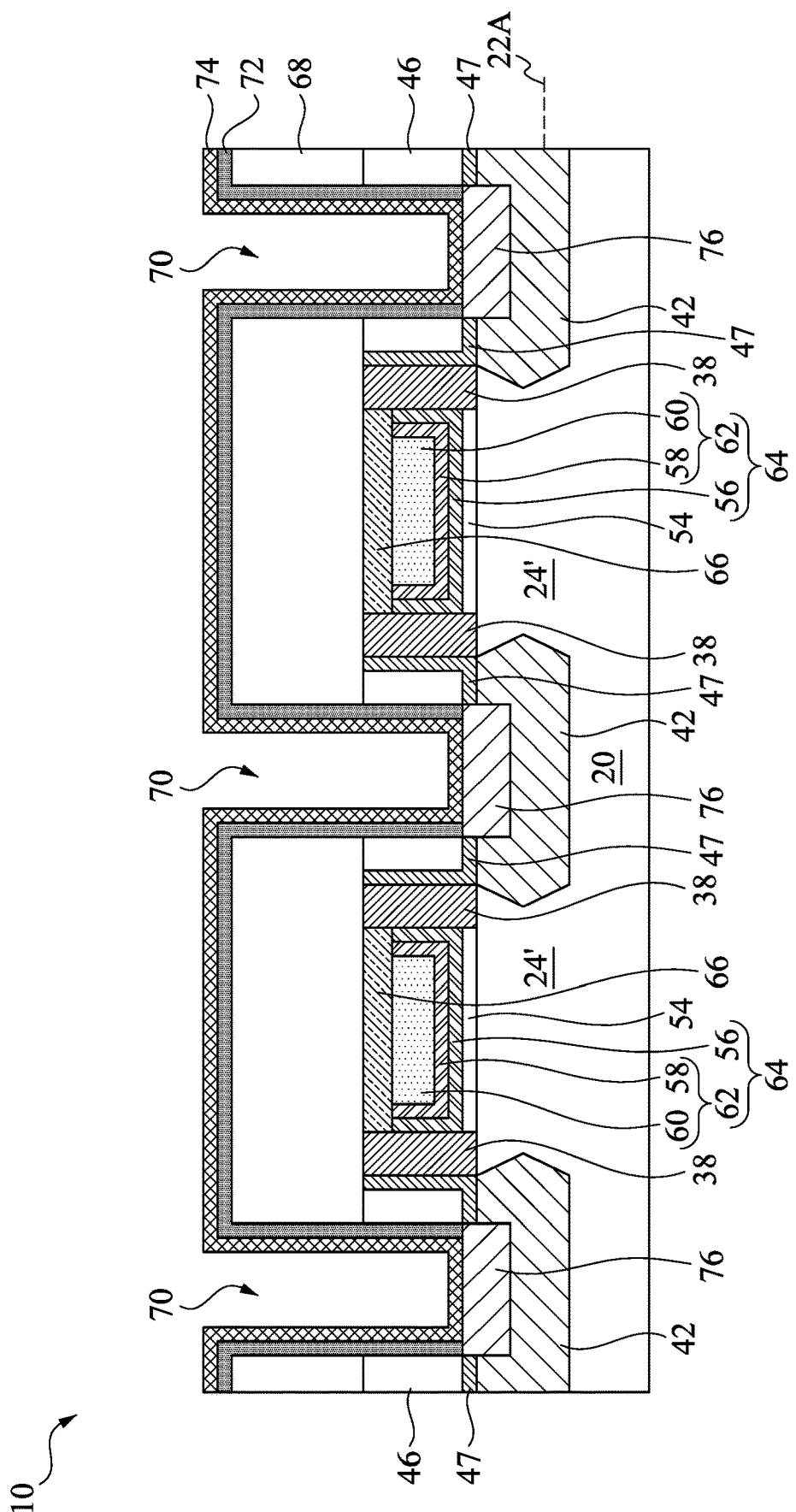

An anneal is then performed to form source/drain silicide regions 76, as shown in FIG. 14. The anneal may be performed through Rapid Thermal Anneal (RTA), furnace anneal, or the like. Accordingly, a bottom portion of the metal layer 72 reacts with the source/drain region 42 to form source/drain silicide regions 76. The sidewall portions of metal layer 72 remain after the silicidation process. In accordance with some embodiments of the present disclosure, the top surface of the source/drain silicide regions 76 is in contact with a bottom surface of the barrier layer 74.

Figure 15:
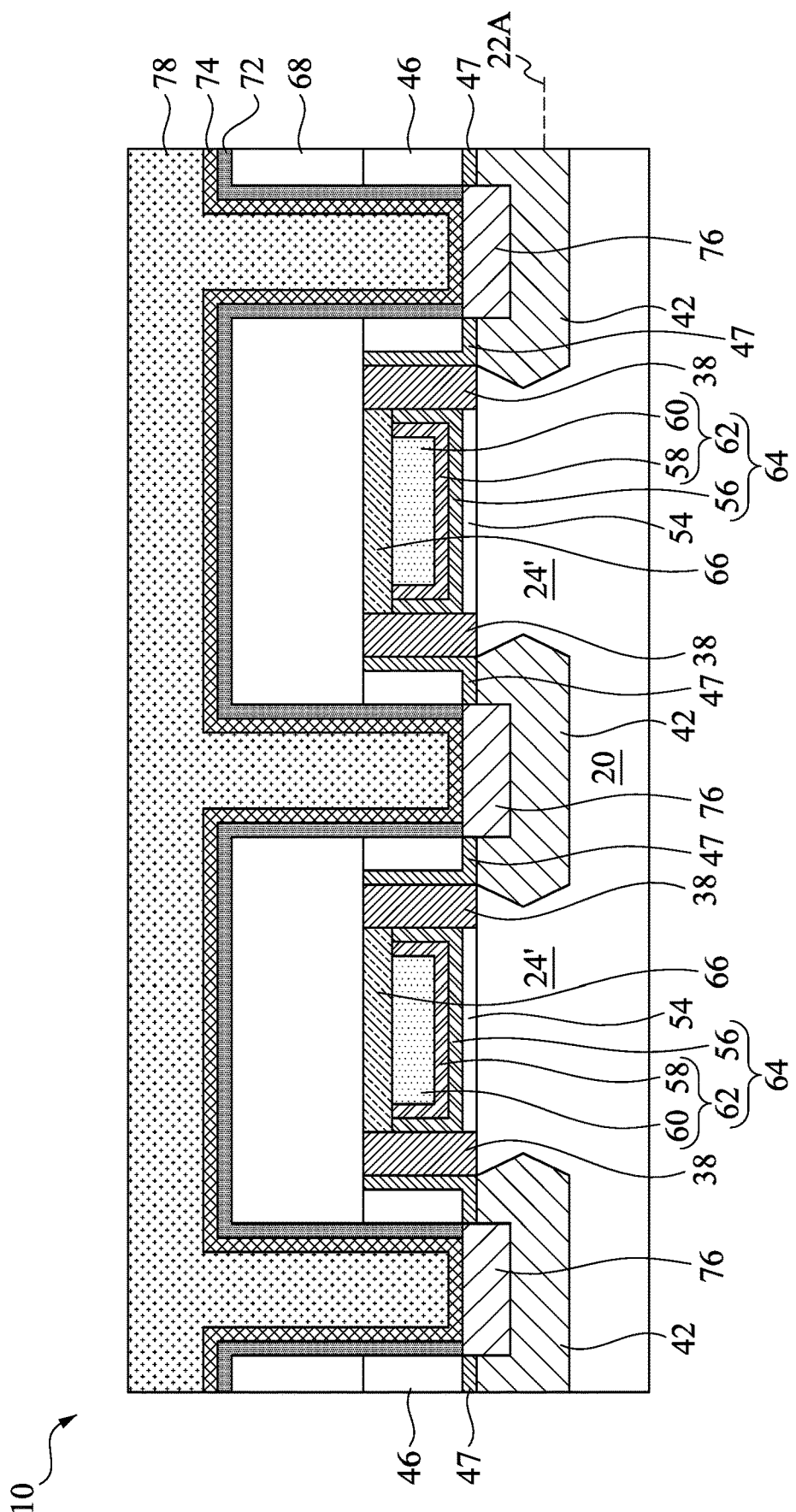
Figure 16:
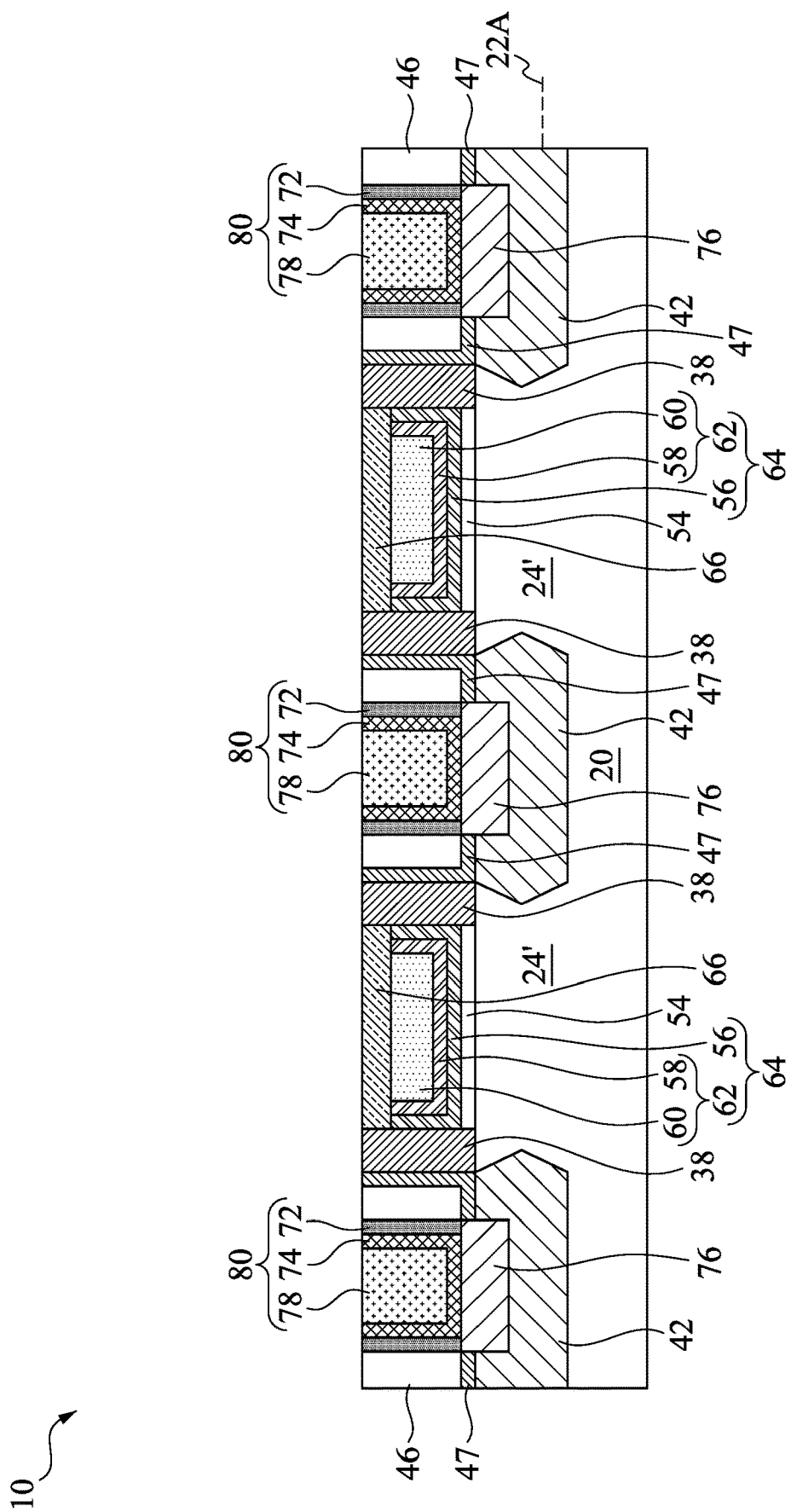

Next, as shown in FIG. 15, a metallic material 78 is deposited over and in contact with the barrier layer 74. The metallic material 78 may include cobalt (Co), silver (Ag), tungsten (W), copper (Cu), gold (Au), platinum (Pt), aluminum (Al). The metallic material 78 is nitrogen-free. A planarization step such as CMP or mechanical grinding is then performed to remove the portions of the metal layer 72, the barrier layer 74, the metallic material 78 and the sacrificial dielectric layer 68 over the ILD 46. The resulting structure is shown in FIG. 16. The remaining portions of the metal layer 72, the barrier layer 74 and the metallic material 78 are referred to as lower source/drain contact plugs 80.

Figure 17:
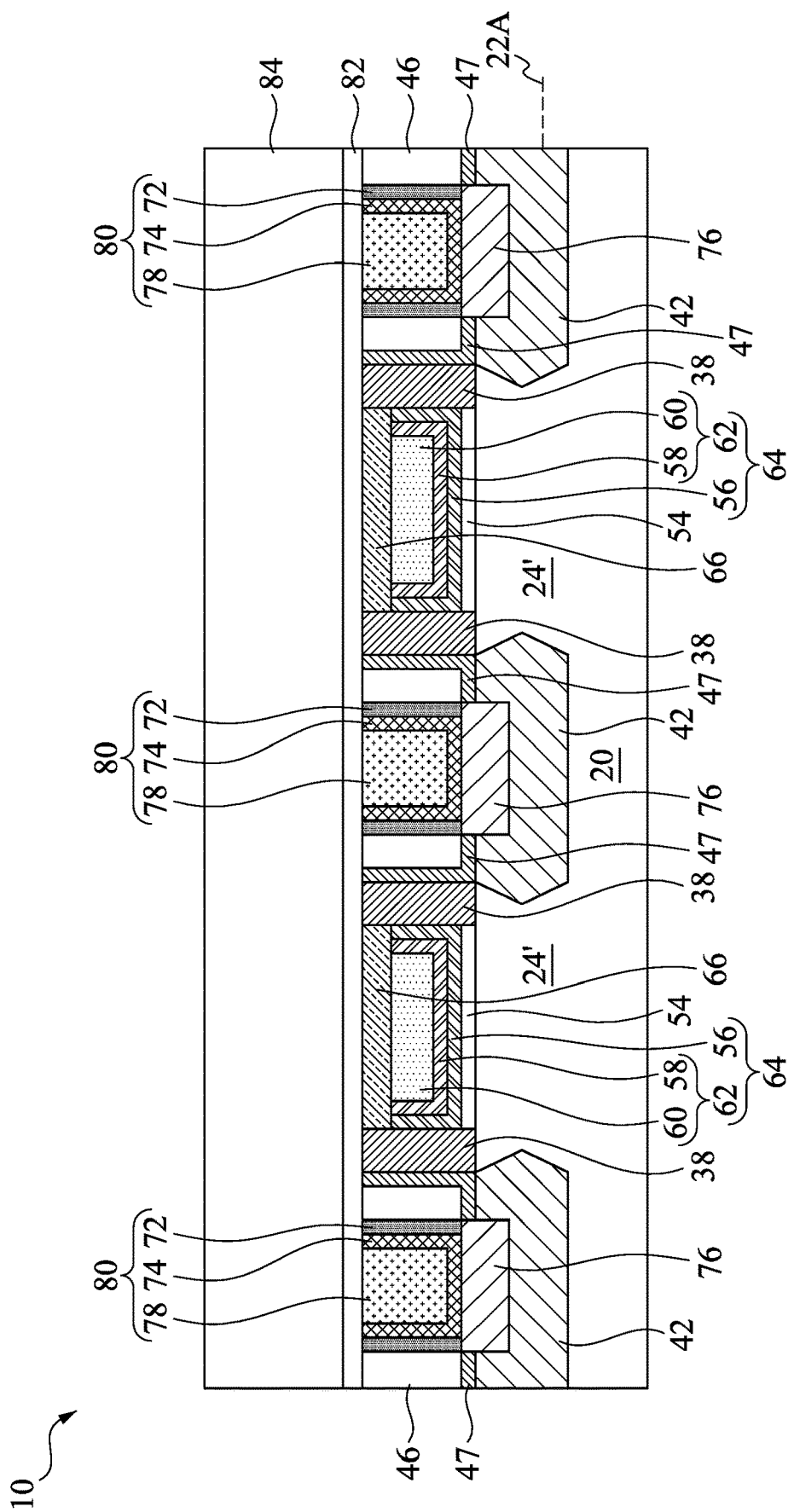

FIGS. 17 through 21 illustrate the formation of upper source/drain contact plugs. Referring to FIG. 17, an etch stop layer 82 is formed, followed by the formation of an ILD 84. Throughout the description, ILD 84 is alternately referred to as ILD1. The etch stop layer 82 may be formed of silicon carbide, silicon oxynitride, silicon carbo-nitride, combinations thereof, or composite layers thereof. The etch stop layer 82 may be formed using a deposition method such as CVD, Plasma Enhanced Chemical Vapor Deposition (PECVD), ALD, or the like. The ILD 84 may include a material selected from PSG, BSG, BPSG, Fluorine-doped Silicon Glass (FSG), TEOS, or other non-porous low-k dielectric materials. The ILD 84 may be formed using spin coating, FCVD, or the like, or formed using a deposition method such as CVD, PECVD, Low Pressure Chemical Vapor Deposition (LPCVD), or the like.

Figure 18:
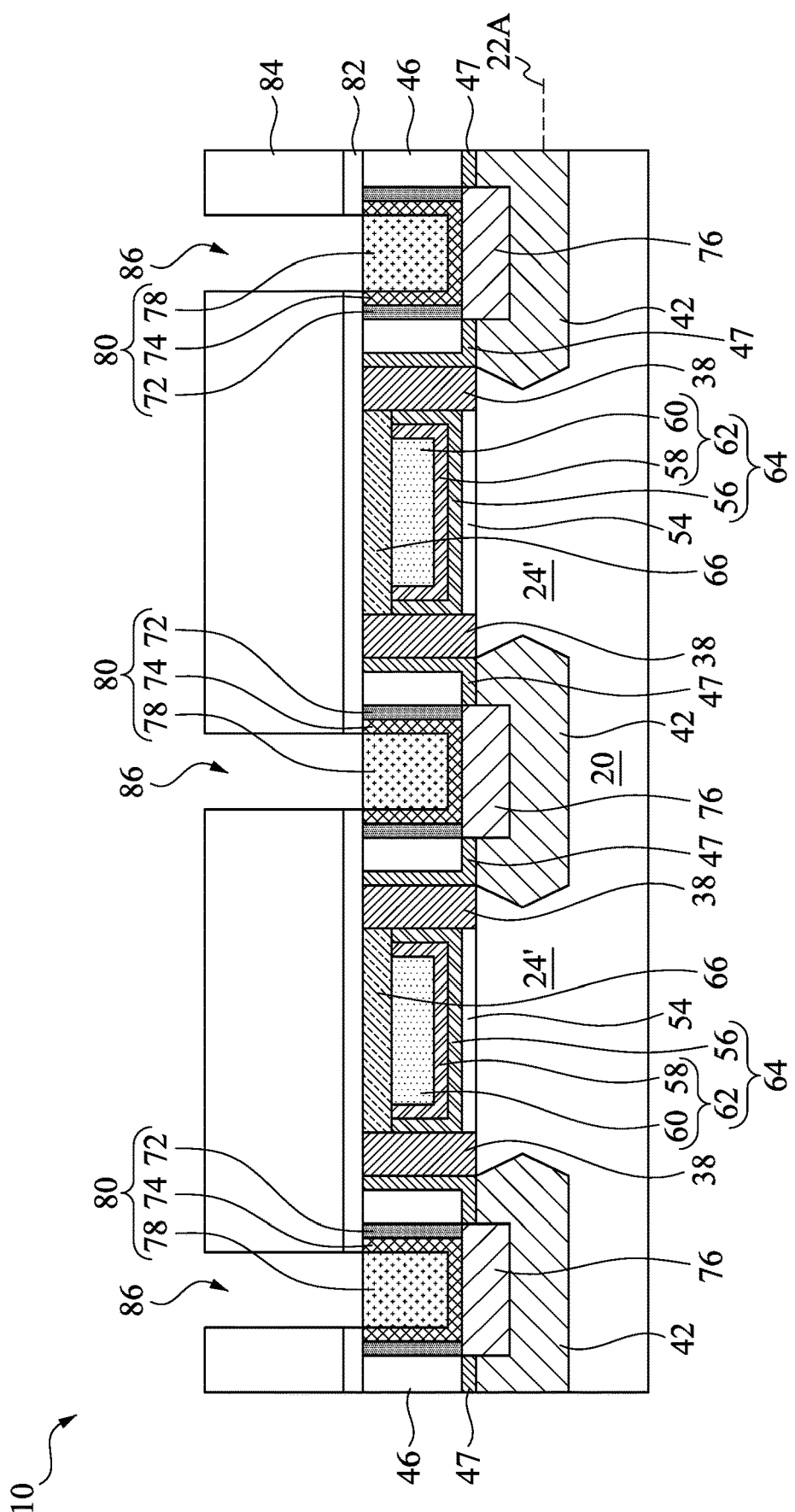

FIG. 18 illustrates the formation of openings 86, which is formed through etching the ILD 84 and the etch stop layer, such that the lower source/drain contact plugs 80 are exposed to the openings 86.

Figure 19A:
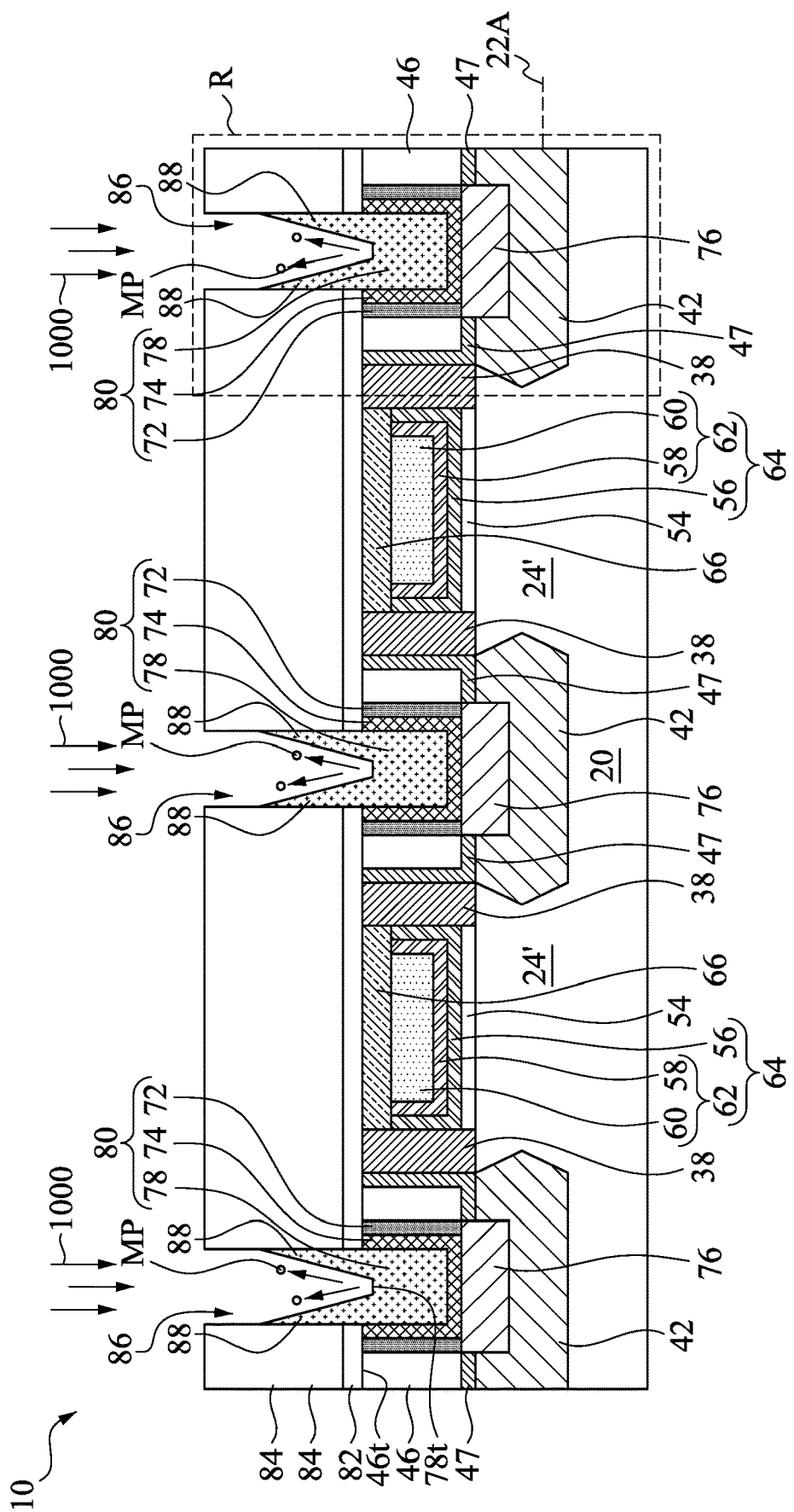
Figure 19B:
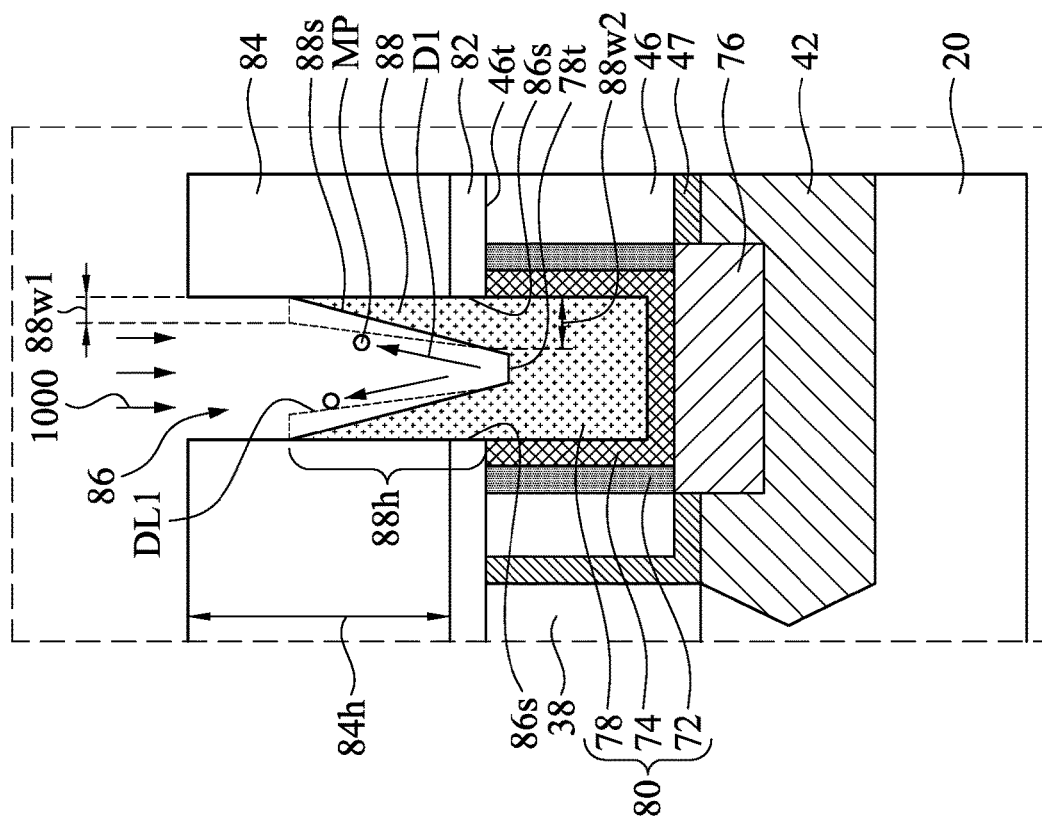

As illustrated in FIG. 19A, a re-sputtering process 1000 is performed on the lower source/drain contact plugs 80 in accordance with various embodiments to re-deposit metal particles MP onto sidewalls 86s of the opening 86 forming a re-depositing layer 88. FIG. 19B is a magnified view of a region R in FIG. 19A. As shown in FIGS. 19A and 19B, the re-sputtering process 1000 may be an argon ion bombardment which is implemented by using an argon plasma beam. In particular, the argon plasma beam is targeted on a top surface of the metallic material 78 of the lower source/drain contact plugs 80, resulting in the metal particles MP re-sputtered from the metallic material 78 of the lower source/drain contact plugs 80 onto opening sidewalls 86s. The ion bombardment also results in recessing a central region of the metallic material 78 to fall below top surfaces of surrounding materials. By way of example and not limitation, the metallic material 78 has a top surface 78t at a position lower than a top surface 46t of the ILD 46. By controlling the bias voltage of the plasma of the re-sputtering process 1000, argon ions strike the top portion of the metallic material 78 of the lower source/drain contact plugs 80. The metal particles MP of the top portion of the metallic material 78 may exhibit high momentum due to collisions with argon ions. As a result, the energetic metal particles MP break constraint of the binding force in the crystal surface of the metallic material 78. Furthermore, the metal particles MP are splashed in a direction D1 toward the sidewalls of the opening 86.

The re-deposited layer 88 and the metallic material 78 of the lower source/drain contact plugs 80 form a U-shaped recess. An interface between the re-deposited layer 88 and the subsequently formed overlying layer has a decreased contact resistance. A topmost position of the re-deposited layer 88 is controlled to be lower than a topmost position of the ILD 84. In some embodiments, the re-deposited layer 88 has a height 88h less than a height 84h of the ILD 84. Therefore, during a subsequent planarization of the subsequently formed layer, the re-deposited layer 88 can be prevented from being dislodged to contaminate the chamber. In some embodiments, the height 88h of the re-deposited layer 88 is in a range from about 10 nm to about 70 nm, and the height 84h of the ILD 84 is in a range from about 1 nm to about 35 nm.

The re-deposited layer 88 has a width decreasing as a distance from the substrate 20 increases. For example, a top width 88w1 of the re-deposited layer 88 is less than a bottom width 88w2 of the re-deposited layer 88, and thus the re-deposited layer 88 has opposing inclined sidewalls 88s relative to a top surface of the substrate 20. In some embodiments, the top width 88w1 of the re-deposited layer 88 is from about 0 nm to about 10 nm and the bottom width 88w2 of the re-deposited layer 88 is from about 0.5 nm to about 20 nm. Although the re-deposited layer 88 illustrated in FIGS. 19A and 19B has a triangular cross section, the re-sputtering process 1000 may lead to trapezoid cross section of the re-deposited layer 88, as indicated by dashed line DL1, in some embodiments. In some embodiments, the metal particles MP is re-puttered using nitrogen, hydrogen, inert gas such as Ar, He or Ne, the like, or combinations thereof.

Figure 20:
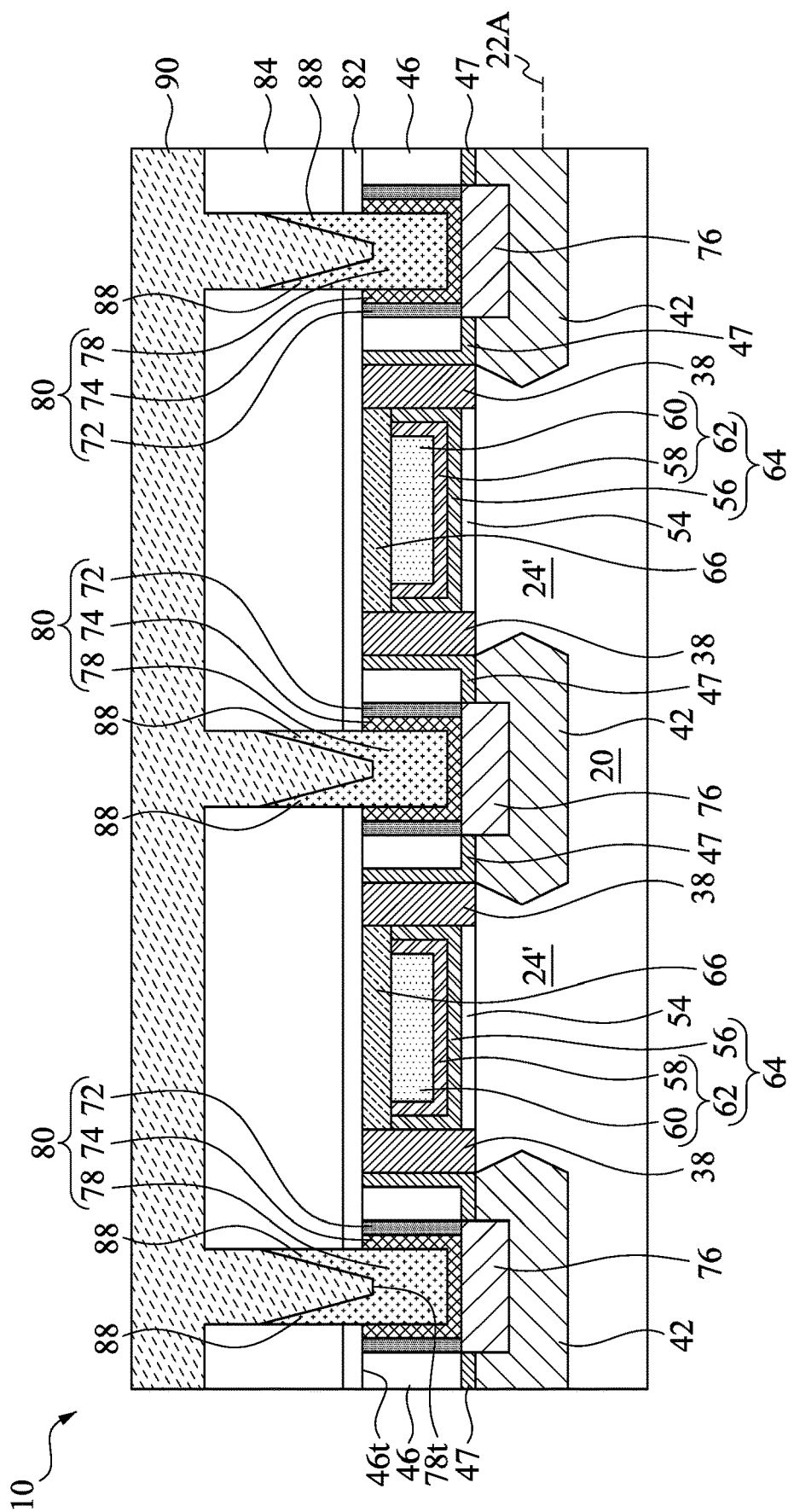
Figure 21:
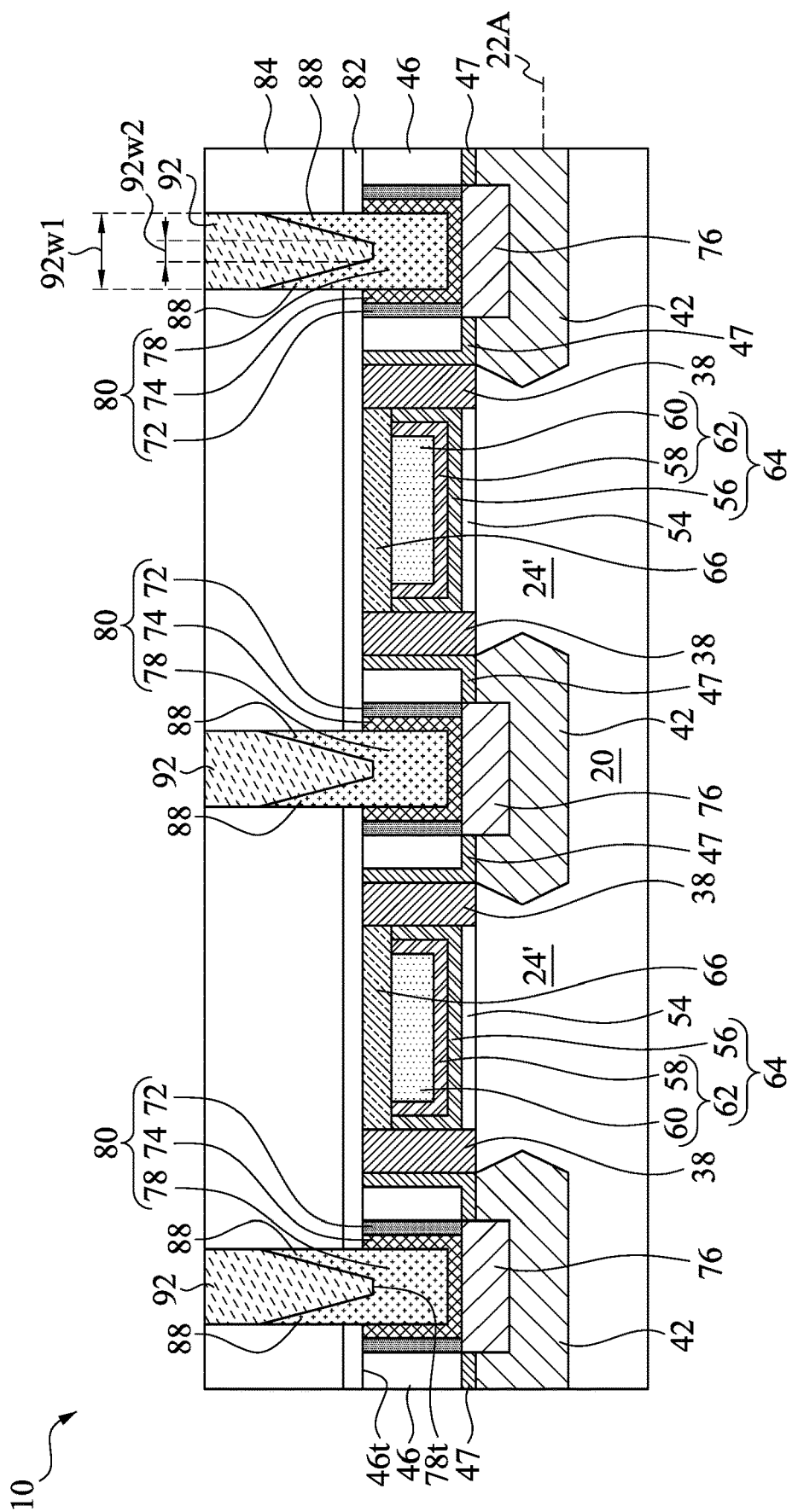

Next, as shown in FIG. 20, a metallic material 90 fills remaining portions of the opening 86 and over the ILD 84. The metallic material 90 extends along and in direct contact with the re-deposited layer 88 and along tops of the ILD 84. Since the topmost position of the re-deposited layer 88 is lower than the topmost position of the ILD 84, a topmost position of the re-deposited layer 88 is lower than a topmost position of the upper source/drain contact plug 92. Due to the presence of the re-deposited layer 88, a top width 92w1 the upper source/drain contact plugs 92 is greater than a bottom width 92w2 of the upper source/drain contact plugs 92. In greater detail, the upper source/drain contact plugs 92 have a width increasing as a distance from the substrate 20 increases. The upper source/drain contact plugs 92 have an upper portion over the lower portion of the upper source/drain contact plugs 92, and a width variation of the lower portion of the upper source/drain contact plugs 92 is greater than a width variation of the upper source/drain contact plugs 92. The metallic material 90 may be formed of nitrogen-free materials such as cobalt (Co), silver (Ag), tungsten (W), copper (Cu), gold (Au), platinum (Pt), aluminum (Al). A planarization step such as CMP or mechanical grinding is then performed to remove a portion of the metallic material 90 over the ILD 84. The remaining portions of the metallic material 90 remain after the planarization step are referred to as upper source/drain contact plugs 92, as shown in FIG. 21. The upper source/drain contact plugs 92 are laterally surrounded by the re-deposited layer 88. The ILD 84 laterally surrounds the upper source/drain contact plugs 92. The material of the metallic material 96 and the material of the lower source/drain contact plugs 80 are different, thus an observable interface is present between the metallic material 96 and the lower source/drain contact plugs 80. A resistivity of the metallic material 96 is different from a resistivity of the lower source/drain contact plugs 80. For example, the lower source/drain contact plugs 80 include copper and the upper source/drain contact plugs 92 include tungsten.

Because the re-deposited layer 88 is suitable for lattice match with the overlying upper source/drain contact plugs 92, lattice mismatch defects caused by a lengthy metal/dielectric interface between upper source/drain contact plugs 92 and the ILD 84 are eliminated. The interface of the re-deposited layer 88 and the upper source/drain contact plugs 92 offers low contact resistance. Such decreased contact resistance beneficially affects yield.

Based on the above discussions, it can be seen that the present disclosure offers advantages. It is understood, however, that other embodiments may offer additional advantages, and not all advantageous are necessarily disclosed herein, and that no particular advantage is required for all embodiments. One advantage is that defects in the upper source/drain contact plugs can be reduced, because the interface between the upper source/drain contact plugs and the surrounding ILD layer is reduced. Another advantage is that the interface between the re-deposited layer and the subsequently formed upper source/drain contact plugs has a decreased contact resistance.

According to some embodiments, a semiconductor device includes a fin structure, a source/drain region, a first inter-layer dielectric (ILD) layer, a first contact plug, and a second contact plug. The fin structure extends above a substrate. The source/drain region is in the fin structure. The first inter-layer dielectric (ILD) layer is over the source/drain region. The first contact plug extends through the first ILD layer to a silicide region of the source/drain region. The second contact plug is over the first contact plug. The first contact plug has a protruding portion extending above the first ILD layer and laterally surrounding a lower part of the second contact plug.

According to some embodiments, a semiconductor device includes a fin structure, a gate structure, a first inter-layer dielectric (ILD) layer, and a lower source/drain contact. The fin structure is on a substrate. The gate structure is on the fin structure. The first inter-layer dielectric (ILD) layer surrounds the gate structure. The lower source/drain contact is over a source/drain region in the first fin structure. The lower source/drain contact has a first portion with a top surface lower than a top surface of the first ILD layer and a second portion protruding from the top surface of the first portion of the lower source/drain contact.

According to some embodiments, a method of forming a semiconductor device includes forming a fin structure over a substrate, forming a gate stack over the fin structure, forming a source/drain region on a side of the gate stack, forming a first contact plug over the source/drain region, forming an inter-layer dielectric (ILD) layer on the first contact plug, etching an opening through the ILD layer at least until the first contact plug is exposed, after etching the opening through the ILD layer, performing an ion bombardment on the exposed first contact plug such that a material of the first contact plug is re-sputtered onto a sidewall of the opening in the ILD layer, and after performing the ion bombardment, forming a second contact plug over the first contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a fin structure over a substrate;
    forming a gate stack over the fin structure;
    forming a source/drain region on a side of the gate stack;
    forming a first contact plug over the source/drain region;
    forming an inter-layer dielectric (ILD) layer on the first contact plug;
    etching an opening through the ILD layer at least until the first contact plug is exposed;
    after etching the opening through the ILD layer, performing an ion bombardment on the exposed first contact plug such that a material of the first contact plug is re-sputtered onto a sidewall of the opening in the ILD layer; and
    after performing the ion bombardment, forming a second contact plug over the first contact plug.

2. The method of claim 1, wherein the ion bombardment is performed such that a central region of the first contact plug is recessed.

3. A method of forming a semiconductor device, comprising:
    forming a fin structure over a substrate;
    forming a gate stack on the fin structure and source/drain regions on opposite sides of the gate stack;
    forming a first contact plug over one of the source/drain regions;
    forming an inter-layer dielectric (ILD) layer on the first contact plug;
    etching an opening through the ILD layer at least until the first contact plug is exposed;
    after etching the opening through the ILD layer, reshaping a top surface of the first contact plug by an ion bombardment such that the reshaped top surface of the first contact plug has two peaks higher than a bottom surface of the ILD layer; and
    after the ion bombardment is complete, forming a second contact plug over the reshaped top surface of the first contact plug.

4. The method of claim 3, wherein the ion bombardment is implemented by using an argon plasma beam.

5. The method of claim 3, wherein the reshaped top surface of the first contact plug has a valley between the peaks.

6. The method of claim 5, wherein the peaks of the reshaped top surface of the first contact plug are lower than a top surface of the ILD layer.

7. The method of claim 5, wherein the valley of the reshaped top surface of the first contact plug is lower than the bottom surface of the ILD layer.

8. The method of claim 3, wherein the reshaped top surface of the first contact plug defines a recess having a width increasing as a distance from the substrate increases.

9. The method of claim 3, wherein the ion bombardment is performed using nitrogen, hydrogen or inert gas.

10. The method of claim 3, wherein the reshaped top surface of the first contact plug has a substantially flat bottom.

11. The method of claim 10, further comprising forming an etch stop layer on the first contact plug before forming the ILD layer, wherein the reshaped top surface of the first contact plug has a valley lower than a bottom surface of the etch stop layer.

12. The method of claim 11, wherein the reshaped top surface of the first contact plug has a peak higher than a top surface of the etch stop layer.

13. A method of forming a semiconductor device, comprising:
    forming a fin structure over a substrate;
    forming a gate stack on the fin structure and source/drain regions on opposite sides of the gate stack;
    forming a first contact plug over one of the source/drain regions;
    forming an inter-layer dielectric (ILD) layer on the first contact plug;
    etching an opening through the ILD layer to expose the first contact plug;
    performing an ion bombardment on the exposed first contact plug to form contact extensions extending upwards from the first contact plug along sidewalls of the opening in the ILD layer, wherein each of the contact extensions has a peak higher than a bottom surface of the ILD layer; and
    forming a second contact plug having a lower portion over the first contact plug and between the contact extensions.

14. The method of claim 13, wherein the second contact plug has a material different from a material of the first contact plug.

15. The method of claim 13, wherein the ion bombardment is performed such that a top surface of a central portion of the first contact plug is lower than the bottom surface of the ILD layer.

16. The method of claim 13, further comprising:
etching back the gate stack; and
forming a gate mask layer over the etched back gate stack, wherein the ion bombardment is performed such that a top surface of a central portion of the first contact plug is lower than a top surface of the gate mask layer.

17. The method of claim 13, wherein the contact extensions has a same metal as the first contact plug.

18. The method of claim 13, wherein the second contact plug has a bottom width and a top width, and the top width is greater than the bottom width.

19. The method of claim 13, wherein the second contact plug has an upper portion over the lower portion, and the lower portion has a width variation greater than a width variation of the upper portion.

20. The method of claim 13, wherein the second contact plug has a resistivity different from a resistivity of the first contact plug.

* * * * *